US009245789B2

(12) United States Patent
Okamoto et al.

(10) Patent No.: US 9,245,789 B2
(45) Date of Patent: Jan. 26, 2016

(54) METHOD FOR FORMING WIRING

(71) Applicant: NEC CORPORATION, Tokyo (JP)

(72) Inventors: Koichiro Okamoto, Tokyo (JP); Munehiro Tada, Tokyo (JP); Hiromitsu Hada, Tokyo (JP); Toshitsugu Sakamoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/433,061

(22) PCT Filed: Aug. 20, 2013

(86) PCT No.: PCT/JP2013/072640
§ 371 (c)(1),
(2) Date: Apr. 2, 2015

(87) PCT Pub. No.: WO2014/057734
PCT Pub. Date: Apr. 17, 2014

(65) Prior Publication Data
US 2015/0262864 A1  Sep. 17, 2015

(30) Foreign Application Priority Data
Oct. 9, 2012  (JP) ................................. 2012-224323

(51) Int. Cl.
*H01L 21/00* (2006.01)
*H01L 21/768* (2006.01)
(Continued)

(52) U.S. Cl.
CPC .... *H01L 21/76802* (2013.01); *H01L 21/02164* (2013.01); *H01L 21/02282* (2013.01);
(Continued)

(58) Field of Classification Search
CPC .................. H01L 21/02282; H01L 21/31144; H01L 21/76802; H01L 21/76832
See application file for complete search history.

(56) References Cited

U.S. PATENT DOCUMENTS 7,838,173 B2 * 11/2010 Chang ..................... G03F 1/144
430/311
8,227,183 B2 * 7/2012 Tsubaki ................ G03F 7/2024
430/326
(Continued)

FOREIGN PATENT DOCUMENTS

JP  07-183194 A  7/1995
JP  2002-222860 A  8/2002
(Continued)

OTHER PUBLICATIONS

J. F. Gibbons, et al., "Switching properties of thin NiO films" Solid-State Electronics, 1964, pp. 785-797, vol. 7.
(Continued)

*Primary Examiner* — Richard Booth
(74) *Attorney, Agent, or Firm* — Sughrue Mion, PLLC

(57) ABSTRACT

The present invention addresses the problem of inhibiting the evolution of a poisoning gas to eliminate wiring-pattern resolution failures and thereby forming a desired wiring layer structure to provide functional elements having an improved property yield. This method for forming multi-layered copper interconnect on a semiconductor substrate comprises: forming a multilayer resist structure to form a given resist pattern on a substrate including an interlayer dielectric film that has via holes which have been formed in part thereof and filled with an SOC layer, the multilayer resist structure comprising an SOC layer, an SOG layer, an $SiO_2$ layer, and a chemical amplification type resist superposed in this order from the substrate side; conducting etching using the resist pattern as a mask to form a pattern for a wiring layer and via plugs; and forming the wiring layer and the via plugs in the pattern.

10 Claims, 26 Drawing Sheets

(51) Int. Cl.
    *H01L 21/311*    (2006.01)
    *H01L 45/00*     (2006.01)
    *H01L 21/02*     (2006.01)

(52) U.S. Cl.
    CPC .... *H01L21/31116* (2013.01); *H01L 21/31122* (2013.01); *H01L 21/31138* (2013.01); *H01L 21/31144* (2013.01); *H01L 21/76808* (2013.01); *H01L 21/76832* (2013.01); *H01L 21/76879* (2013.01); *H01L 45/085* (2013.01); *H01L 45/1206* (2013.01); *H01L 45/1233* (2013.01); *H01L 45/1266* (2013.01); *H01L 45/145* (2013.01); *H01L 45/1675* (2013.01); *H01L 21/76814* (2013.01); *H01L 2221/1036* (2013.01)

(56) References Cited

U.S. PATENT DOCUMENTS

| | | | |
|---|---|---|---|
| 8,808,974 B2 * | 8/2014 | Nishimura | G03F 7/0035 430/325 |
| 2004/0144491 A1 | 7/2004 | Ohuchi et al. | |
| 2005/0074695 A1 | 4/2005 | Nakamura et al. | |
| 2006/0097399 A1 | 5/2006 | Hatano et al. | |
| 2007/0269746 A1 | 11/2007 | Nakamura | |
| 2010/0115479 A1 | 5/2010 | Hatano et al. | |

FOREIGN PATENT DOCUMENTS

| | | | |
|---|---|---|---|
| JP | 2004-172403 | A | 6/2004 |
| JP | 2004-179393 | A | 6/2004 |
| JP | 2006-156998 | A | 6/2006 |
| JP | 2007-310086 | A | 11/2007 |
| JP | 4571880 | B2 | 10/2010 |
| JP | 2011-091317 | A | 5/2011 |

OTHER PUBLICATIONS

D. C. Kim, et al., "Electrical observations of filamentary conductions for the resistive memory switching in NiO films" Applied Physics Letters, 2006, pp. 202102-1-202102-3, vol. 88.

M. N. Kozicki, et al., "Information storage using nanoscale electrodeposition of metal in solid electrolytes" Superlattices and Microstructures, 2003, pp. 459-465, vol. 34.

R. Waser, et al., "Nanoionics-based resistive switching memories" Nature Materials, Nov. 2007, pp. 833-840, vol. 6.

M. Tada, et al., "Highly scalable nonvolatile TiOx/TaSiOy solid-electrolyte crossbar switch integrated in local interconnect for low power reconfigurable logic" IEEE IEDM Technical Digest, 2009, pp. 493-496.

International Search Report of PCT/JP2013/072640 dated Sep. 24, 2013 [PCT/ISA/210].

* cited by examiner

METHOD FOR FORMING WIRING

CROSS REFERENCE TO RELATED APPLICATIONS

This application is a National Stage of International Application No. PCT/JP2013/072640, filed Aug. 20, 2013, claiming priority based on Japanese Patent Application No. 2012-224323, filed Oct. 9, 2012, the contents of all of which are incorporated herein by reference in their entirety.

TECHNICAL FIELD

The present invention relates to a method for forming wiring.

BACKGROUND ART

Semiconductor devices, especially silicon devices, have been more highly integrated to achieve lower power consumption through miniaturization following the scaling law known as "Moore's Law". Highly integrated devices have been developed so far at the pace of increasing the number of transistors in the devices four times every three years. In recent years, the gate length of a MOSFET is 20 nm or smaller. Because of rising costs for lithography processes, including costs of apparatus and mask set, and the physical limits such as operation limit and fluctuation limit of device scaling, there has been need for improvement in device performance through an approach other than the following scaling law.

As a functional element which is formed inside a multi-layered copper interconnect on a semiconductor device, a variable resistance type non-volatile element (hereinafter, referred to as "resistance changing element"), a capacitor (capacitance element) or the like is exemplified.

As the capacitor which is mounted on a logic LSI with other components, the embedded DRAM, the decoupling capacitor or the like is exemplified. By mounting the capacitor on a copper wiring, it is possible to make the capacitor have a large capacity and a small size.

As a device which is assessed as a middle position between the gate array and the standard cell, a device which is called as FPGA has been developed. The device makes it possible to configure desired circuit by a customer after a chip is fabricated. By intervening a resistance variable element or the like as programmable element in a wiring connection point, it becomes possible to carry out electrical wiring connection by the customer his-self. By using the semiconductor device mentioned above, it is possible to improve flexibility of a circuit design.

As the resistance changing element, ReRAM (Resistive Random Access Memory) using metal oxide, a solid electrolyte switch element using a solid electrolyte or the like is exemplified.

The resistance changing element has three layers structure that a variable resistance layer is interposed between an upper electrode and a lower electrode, and uses a phenomenon that electric resistance of the variable resistance layer is varied by applying a voltage between the electrodes. The phenomenon that the electric resistance of the variable resistance layer is varied by applying the voltage has been researched since the 1950s to the 1960s, and the phenomena that the electric resistance of a variable resistance layer 3, which use various metal oxides, is varied have been reported up to now. For example, non-patent literatures 1 and 2 report the resistance changing element which uses nickel oxide (NiO) (non-patent literatures 1 and 2).

Several researches on the solid electrolyte switch element, which uses the solid electrolyte as the variable resistance layer, have been reported since the late 1990s, and the phenomena that the electric resistance of the variable resistance layers, which are made of various solid electrolyte materials, is varied is confirmed. For example, non-patent literatures 3 and 4 report the phenomenon that the electric resistance of the variable resistance layer, which is made of the chalcogenide compound, is varied (non-patent literatures 3 and 4). Moreover, also a method for forming the element in the multi-layered copper interconnect arranged on the semiconductor device is known. For example, patent literature 1 and non-patent literature 5 report a solid electrolyte switch element which is fabricated inside a multi-layered copper interconnection layer on a CMOS substrate (patent literature 1 and non-patent literature 5).

The solid electrolyte switch element is an element which has structure that a solid electrolyte is interposed between two electrodes. For example, in the case of applying a negative voltage to one out of the two electrodes, a metal atom, which is included in the other electrode, is ionized to be eluted into the solid electrolyte, and then a metallic bridge is formed. By the metallic bridge connecting two electrodes, the switch is changed to be in an ON state which has low electric resistance. On the other hand, in the case of applying a positive voltage to one out of the two electrodes, the metallic bridge is solved into the solid electrolyte and two electrodes are electrically isolated each other. As a result, the switch is changed to be in an OFF state which has high electric resistance. As mentioned above, the solid electrolyte switch element can carry out non-volatile and repetitive switching between the ON state and the OFF state. By using the properties, it is possible to realize application to a non-volatile memory or a non-volatile switch.

Here, recently, it is required to make the semiconductor device furthermore large-scale-integrated and micronized. In order to restrain increase of wiring resistance, and capacitance between wirings which is caused by micronization, Cu/low permittivity (low-k) wiring layer is used. It is preferable to make a process temperature in a multi-layered interconnect forming process as low as possible in order to arrange each kind of BEOL (Back End Of Line) device (for example, a solid electrolyte switch element or the like) in the wiring layer. However, due to making the process temperature low, poisoning gas is evolved increasingly through a via hole, which is opened on an upper electrode of the BEOL device, in the via first dual damascene process, and a chemically amplification type material, which is included in an applied photo resist (PR), becomes inactive at a time of exposure for wiring after opening the via hole. As a result, there is a problem that a resolution failure of wiring pattern is caused.

Meanwhile, as a method for preventing the poisoning phenomenon, the multilayer resist process have been used usually. For example, the method of inserting a Spin-on-Glass (SOG) layer or an $SiO_2$ layer as a block layer against the poisoning gas is known. As the conventional dual damascene wiring groove exposure technology, the patterning method, which uses a multilayer resist structure such as Spin-on-Carbon (SOC)/SOG/anti-reflection film (BARC: Bottom Anti Reflection Coating)/PR, $SOC/SiO_2/BARC/PR$ or the like superposed in this order from the substrate side, is known. However, since it has been progressed to make the resist thin in order to form furthermore micronized wiring pattern, and it becomes necessary to make the block layer (SOG or $SiO_2$) thin together with to make the process temperature low. As a result, it becomes difficult to suppress the evolution of the poisoning gas thoroughly.

Moreover, a case of using the $SiO_2$ layer as the block layer is more superior in the block properties than a case of using the SOG layer as the block layer. However, in the case of using the $SiO_2$ layer, there is a problem that adhesiveness between the SOC layer and the $SiO_2$ layer is weak, and consequently exfoliation is apt to be caused.

Furthermore, in the case that mis-alignment is generated, a method that only an upper resist layer (resist layer which exists over block layer) is exfoliated and removed by use of the $O_2$ ashing or the organic solvent, and an upper resist layer is applied again, and an exposure and development process is carried out is used. However, the block film such as the SOG film or the $SiO_2$ film, which is formed at low temperature, has a problem that its refraction factor is changed due to the $O_2$ ashing process, and the block film is exfoliated by using the organic solvent.

Meanwhile, as another method for solving the resolution failure of wiring pattern, the method of making places, at which the poisoning gas is evolved, distributed by increasing number of the via holes per an unit area, or the method of making an etch stopping layer, which exists at a bottom of the via, have two layers structure is known. However, when forming the BEOL device inside the multi-layered copper interconnect, it is necessary to design wiring layer structure with offering preference to device properties. Then, it is desired to take a measure for solving the evolution of the poisoning gas not-dependently on the wiring layer structure.

As a method for preventing degradation of the block layer, which is caused by the above-mentioned $O_2$ ashing, and washing by use of the organic solvent, in three-layered resist structure, a patent literature 2 discloses an art that a TEOS layer whose film is formed with the low temperature CVD method is used as the block layer (patent literature 2).

Moreover, a patent literature 3 discloses an art that, in order to improve a dry etching selectivity between an SOC layer and a block layer which is an upper layer of the SOC layer, an $SiO_2$ layer or an $Si_3N_4$ layer whose film is formed with the CVD method using the high density plasma is used as the block layer (patent literature 3).

CITATION LIST

Patent Literature

Patent literature 1: Japanese Laid-Open Patent No. 2011-091317
Patent literature 2: Japanese Patent No. 4571880
Patent literature 3: Japanese Laid-Open Patent No. Hei 7-183194

Non Patent Literature

Non patent literature 1: J. F. Gibbons, et al., "Switching properties of thin NiO films" Solid-State Electronics Vol. 7, pp. 785-790, 1964
Non patent literature 2: D. C. Kim, et al., "Electrical observations of filamentary conductions for the resistive memory switching in NiO films" Applied Physics Letters Vol. 88, p. 202102, 2006
Non patent literature 3: M. N. Kozicki, et al., "Information storage using nanoscale electrodeposition of metal in solid electrolytes" Superlattices and Microstructures Vol. 34, pp. 459-465, 2003
Non patent literature 4: R. Waser, et al., "Nanoionics-based resistive switching memories" Nature Materials Vol. 6, pp. 833-840, 2007
Non patent literature 5: M. Tada et. al., "Highly scalable nonvolatile $TiO_x/TaSiO_y$ solid-electrolyte crossbar switch integrated in local interconnect for low power reconfigurable logic" IEEE IEDM Technical Digest, pp. 493-496, 2009

SUMMARY OF INVENTION

Problems to be Solved by the Invention

However, even in the case of using the art described in the patent literature 2, it is difficult to sufficiently block the poisoning gas which is evolved from the lower layer.

Moreover, in the case of using the art described in the patent literature 3, when forming the film of the $SiO_2$ layer or the $Si_3N_4$ layer by use of the high density plasma, a surface of the SOC layer which is a lower layer of the $SiO_2$ layer or the $Si_3N_4$ layer is etched. As a result, it is impossible to meet a demand for the via first process that the via hole is filled with the SOC layer so as to be flat.

Therefore, at the present time, there is no effective method to suppress the evolution of the poisoning gas not dependently on the wiring layer structure.

The present invention is conceived to solve the problems which the above-mentioned arts have. An object of the present invention is to provide a wiring forming method which can form desired wiring layer structure and can form functional elements having an improved property yield by suppressing evolution of poisoning gas to eliminate wiring-pattern resolution failures.

Means for Solving Problem

To solve the above-mentioned problem, a first aspect of the present invention is a wiring forming method characterized by comprising: forming a multilayer resist structure to form a given resist pattern on a substrate including an interlayer insulating film that has via holes which have been formed in part thereof and filled with an SOC layer, the multilayer resist structure comprising an SOC layer, an SOG layer, an $SiO_2$ layer, and a chemically amplification type resist superposed in this order from the substrate side; conducting etching using the resist pattern as a mask to form a pattern for a wiring layer and a via plug; and forming the wiring layer and the via plug in the pattern.

Effect of the Invention

According to the present invention, it is possible to suppress the evolution of poisoning gas and to expose the prescribed wiring pattern by forming the multilayer resist structure on the semiconductor substrate, which includes the via hole, at a time when exposing the wiring. Furthermore, it is possible to improve the property yield of the functional elements such as a solid electrolyte switch each of which is formed so as to be connected with a wiring and a via which are formed as mentioned above.

DESCRIPTION OF EMBODIMENTS

Figure 1:
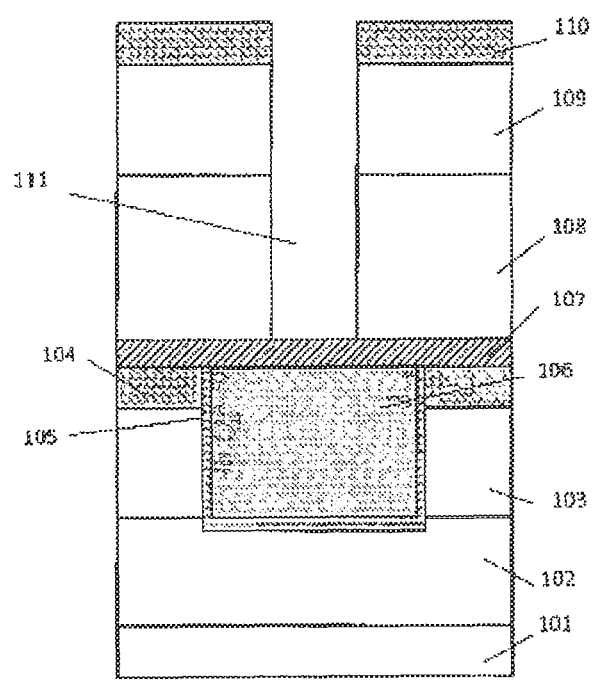
FIG. 1 is a cross section for explaining a method of fabricating a multi-layered interconnection layer arranged on a semiconductor substrate according to the present invention.

Hereinafter, a preferable exemplary embodiment of the present invention will be explained with reference to the drawings.

Before explaining the exemplary embodiment of the present invention in detail, technical terminologies according to the present invention will be explained in the following.

A semiconductor substrate includes a substrate on which a semiconductor device is configured, a single crystal substrate, an SOI (Silicon Insulator) substrate, a TFT (Thin Film Transistor) substrate, and a substrate which is used for manufacturing a liquid crystal or the like.

A plasma-enhanced CVD (Chemical Vapor Deposition) method is a method comprising: supplying a reaction room, whose inside pressure is reduced, continuously with raw material of gas or raw material of liquid which is evaporated; making molecules of the raw material enter into an excited state by use of plasma energy; and forming a continuous film on a substrate by gas phase reaction, substrate surface reaction or the like.

A CMP (Chemical Mechanical Polishing) method is a method comprising: making an unevenness of a surface of wafer, which is generated in a process of forming a multi-layered interconnection layer, flat by making the surface of wafer bring in contact with a polishing pad, which is rotated, with making liquid abrasive flow on the surface of wafer. To make the surface of wafer even is carried out by polishing excessive copper, which is embedded in a groove, to form an embedded wiring (damascene wiring) or by polishing an interlayer insulating film.

A barrier metal is a conductive film having barrier properties of preventing metal elements, which is included in a wiring, from diffusing into the interlayer insulating film or a lower layer thereof by covering a side surface and a bottom surface of the wiring. For example, when a material, which composes the wiring, is a metal whose main component is Cu, a refractory metal, a nitride thereof or the like, or a laminated film thereof such as tantalum (Ta), tantalum nitride (TaN), titanium nitride (TiN) or tungsten carbon nitride (WCN) is used as the barrier metal. These films have a property easy to be carried out dry etching processing and have good matching with the conventional LSI fabrication process.

A barrier insulating film is a film which is formed on an upper surface of a Cu wiring, and has a function of preventing Cu from being oxidized and diffused into an insulating film, and has a role as an etching stopping layer at a time of processing. For example, an SiC film, an SiCN film, an SiN film, a laminated film which laminates these films or the like is used.

The present invention is characterized in that, when forming a multi-layered copper interconnect on a semiconductor substrate, via holes are formed in a part of an interlayer insulating film which includes, at least, a low permittivity film or an insulating film including nitrogen, and subsequently multilayer resist structure, which comprises, at least, an SOC layer, a high density $SiO_2$ layer, and a chemically amplification type resist superposed in this order from the substrate side, is formed to form a prescribed resist pattern.

The reason why the via hole is filled with the SOC layer is to dissolve a step difference which is caused by a difference in density of the vias, and to secure a focus margin when exposing an upper layer.

By using the high density $SiO_2$ layer as a block layer, it becomes possible to effectively suppress evolution of the poisoning gas, even when the block layer is made thinner. Furthermore, in the case of exfoliating an upper resist when misalignment is caused, the refraction factor of the block layer is not changed and the block layer is not exfoliated.

By inserting the SOG layer on the SOC layer after forming the SOC layer and before forming the $SiO_2$ layer to compose structure of SOC layer/SOG layer/$SiO_2$ layer which are superposed in this order from the substrate side, for example, it is possible to suppress the SOC layer from being etched in the process of forming a film of the high density $SiO_2$ layer by use of a high density plasma source.

The present invention is characterized in that an SiCN film or an SiN film is exposed at a bottom of the via hole, and a lower layer of the film is made of Ta, Ti or a nitride thereof. When the bottom of the via hole has the above-mentioned structure, it is necessary not to carry out excessive etching to an insulating film which exists at the bottom and to leave the insulating film thick by adjusting a dry etching condition so that the insulating film may not be penetrated and a surface of a metallic film, which is a lower layer, may not be exposed and may not be eroded when forming the via hole by carrying out the dry etching. However, in the case that the insulating film at the bottom of the SiCN layer or the SiN layer is left thick, the poisoning gas is evolved increasingly from the inside of the insulating film, and causes exposure failures of the wiring pattern. Accordingly, when the bottom of the via hole has the above-mentioned structure, by using the multilayer resist structure which comprises the SOC layer/SOG layer/$SiO_2$ layer superposed in this order from the substrate side on the substrate after forming the via hole, it is possible to suppress the evolution of the poisoning gas and to prevent the resolution failures of the wiring pattern.

It is preferable that the $SiO_2$ layer is a high density $SiO_2$ layer whose density is 2.1 $g/cm^3$ or higher. By using the high density $SiO_2$ layer, it is possible to sufficiently suppress the evolution of the poisoning gas by virtue of the fine film structure. Furthermore, it is possible not only to make the $SiO_2$ layer densified highly but also to make the $SiO_2$ layer thin, and it is possible also to make the wiring pattern fine.

It is preferable that the high density $SiO_2$ layer is formed by use of the high density plasma (HDP) whose electron density is $10^{10}$ electrons/$cm^3$ or higher. By use of the chemical vapor phase deposit method (CVD) using the above-mentioned HDP, it is possible to deposit the $SiO_2$ layer, which has the above-mentioned high density, at the lower substrate temperature, for example, also at 200° C. in comparison with the plasma-enhanced CVD method which does not use HDP.

It is preferable that the high density $SiO_2$ layer is formed at substrate temperature of 250° C. or lower. The reason is to suppress that the SOC layer, which is a lower layer of the SOG layer, is decomposed by heat during deposition of the high density $SiO_2$ layer. As a result, it is possible to form the prescribed multilayer resist structure. Moreover, from a point of view of a deposition rate of the high density $SiO_2$ layer, it is preferable that the substrate temperature is 150° C. or higher.

As the method of forming the high density $SiO_2$ film, the Plasma-Enhanced Atomic Layer Deposition (PE-ALD) method may be used. In the case that the $SiO_2$ film is formed on the SOC layer with the ALD method, the $SiO_2$ film has weak adhesiveness and consequently is exfoliated easily. By adopting structure that the SOG layer, which has the same SiO component, is interposed between the ALD-$SiO_2$ film and the SOC layer, it is possible to secure the adhesiveness.

The present invention is characterized in that, after raw material of liquid is applied on the substrate, the SOG layer is formed by carrying out heat treatment. By carrying out the method of forming the SOG layer, it is possible to form the SOG layer on the SOC layer without degrading film quality of the SOC layer which is a lower layer of the SOG layer. Furthermore, also in the case of a semiconductor substrate whose diameter is 300 mm, it is possible to form the SOG layer, whose film thickness and film quality are uniform over a whole surface of the substrate, with a low cost and high throughput.

It is preferable that a total of film thicknesses of the SOG layer and the $SiO_2$ layer is 100 nm or less. The reason is that it is necessary to remove a whole of the SOG layer and the $SiO_2$ layer except for the SOC layer out of the layers, which are included in the multilayer resist structure, simultaneously during the etching process for a wiring layer which is a lower part of the multilayer resist structure. By setting a total of film thicknesses of the SOG layer and the $SiO_2$ layer to be not more than 100 nm in order to make the wiring layer fine, it is possible to remove the SOG layer and the $SiO_2$ layer simultaneously during the etching process for the wiring layer. Here, by using the high density $SiO_2$ layer as the $SiO_2$ layer, it is possible to make a total of film thicknesses of the SOG layer and the $SiO_2$ layer thin, that is, 100 nm or less. Meanwhile, from a point of view of securing uniformity and reproducibility of the applied film thickness of the SOG layer, and securing ability sufficiently to suppress the evolution of the poisoning gas, a total of film thicknesses has a lower limit of 50 nm.

Moreover, it is preferable that the film thickness of the SOG layer is in an range from 15 nm to 60 nm, and the film thickness of the $SiO_2$ layer is in an range from 30 nm to 80 nm. By setting the film thickness of the SOG layer to be in the range from 15 nm to 60 nm, it is possible to protect the SOC layer, which is a lower layer of the SOG layer, sufficiently from a plasma atmosphere during deposition of the high density $SiO_2$ layer. By setting the film thickness of the high density $SiO_2$ layer, which is an upper layer of the SOG layer, to be in the range from 30 nm to 80 nm, it is possible to sufficiently suppress the evolution of the poisoning gas. Furthermore, by setting the film thicknesses of the SOG layer and the high density $SiO_2$ layer as mentioned above, with restraining an influence of light interference caused at a time of exposure, it is possible to remove the SOG layer and the $SiO_2$ layer simultaneously while carrying out the etching process to the wiring layer. As a result, after forming the PR layer without inserting any anti-reflection coating (BARC) on the high density $SiO_2$ layer, it is possible to form a desired fine wiring pattern by the exposure. The most desirable film thickness is 40 nm in the case of the SOG layer, and 60 nm in the case of the $SiO_2$ layer.

The present invention is characterized in that the high density plasma includes, at least, raw material of silane and an oxidizing gas. Moreover, it is preferable that $SiH_4$ is included as the raw material of silane, and $N_2O$ is included as the oxidizing gas, and furthermore it is preferable that Ar is included as an inert gas. By using mixture of $SiH_4$ and $N_2O$, it is possible to form the homogeneous $SiO_2$ layer which does not include any by-product. Moreover, Ar is used for making the high density plasma generated easily and making the high density plasma stabilized. By generating the high density plasma, which includes these gases, over the semiconductor substrate, it is possible to form the high density $SiO_2$ layer which has fine structure.

Hereinafter, a first exemplary embodiment for carrying out the present invention will be explained with reference to attached drawings.

Figure 26:
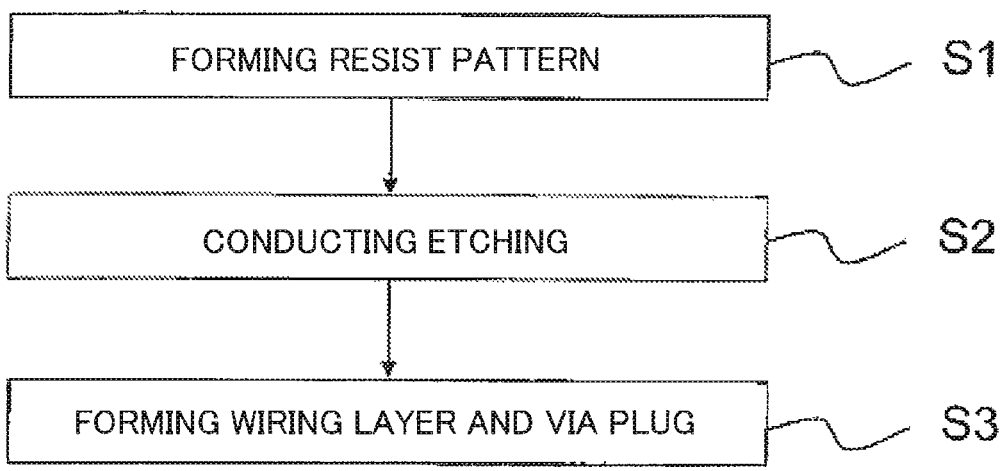
FIG. 26 is a flow diagram showing an outline of a wiring forming method according to the present invention.

An outline of the exemplary embodiment is shown in FIG. 26. That is, the exemplary embodiment relates to a method for forming a copper wiring pattern on a substrate including an interlayer insulating film that has via holes which has been formed in part thereof, and particularly relates to a wiring forming method for fabricating a functional element. The method is characterized by comprising: forming a given resist pattern by forming a multilayer resist structure, which comprises an SOC layer, an SOG layer, an $SiO_2$ layer, and a chemically amplification type resist superposed in this order from the substrate side, on the semiconductor substrate (S1 in FIG. 26); conducting etching using the resist pattern as a mask to form a pattern for a wiring layer and a via plug (S2 in FIG. 26); and forming the wiring layer and the via plug in the pattern (S3 in FIG. 26), in order to improve exposure failures of the wiring pattern.

First Exemplary Embodiment

Each of FIG. 1 to FIG. 8 is a cross section for explaining a series of processes of: forming the via hole in a part of the interlayer insulating film, which is arranged on the semiconductor substrate, by carrying out the lithography and the dry etching; subsequently depositing the multilayer resist structure according to the present invention on the via hole; forming a desired wiring pattern by carrying out the lithography; and forming a copper wiring, which is connected with a lower layer wiring through the via, in the dual damascene process, out of processes for fabricating the copper wiring on the semiconductor substrate. Structure of the substrate, on which the copper wiring is formed, in the exemplary embodiment includes a semiconductor substrate 101, an interlayer insulating film 102, an interlayer insulating film 103, a cap insulating film 104, a barrier metal 105, a first wiring 106, a barrier insulating film 107 and a via hole 111. The semiconductor substrate 101 defined here may be a semiconductor substrate with no component, or may be a semiconductor substrate on whose surface a semiconductor element (not shown in the drawing) is formed.

Moreover, as shown in FIG. 1, the via hole 111 penetrates an inter-via-layer insulating film 108 and an interlayer insulating film 109 and a cap insulating film 110 to be opened. While a bottom of the via hole is arranged on the barrier insulating film 107, the bottom of the via hole may be arranged in the barrier insulating film 107 whose upper surface is etched partially.

Here, the interlayer insulating films 102, 103 and 109, the inter-via-layer insulating film 108 and the cap insulating films 104 and 110 may be a silicon oxide film or may be an SiOCH film which has lower relative permittivity than that of the silicon oxide film, but it is preferable that the interlayer insulating film 102 and 103 are made of materials different each other in order to make the interlayer insulating film 102 an etching stopper layer in the dry etching process for forming the first wiring 106. Similarly, it is preferable that the inter-via-layer insulating film 108 and the interlayer insulating film 109 are made of materials different each other. Moreover, any of the interlayer insulating films 102, 103 and 109, and the inter-via-layer insulating film 108 may be an interlayer insulating film which is a laminated film including plural insulating films. For example, the interlayer insulating film 102 is a silicon oxide film whose film thickness is 300 nm, and each of the interlayer insulating films 103 and 109 is an SiOCH film whose film thickness is 150 nm, and each of the cap insulating films 104 and 110 is a silicon oxide film whose film thickness is 100 nm, and the inter-via-layer insulating film 108 is a silicon oxide film whose film thickness is 150 nm.

It is possible to fabricate the above-mentioned structure of the copper wiring layer by carrying out a method which is the usual method in the technical field.

Figure 2:
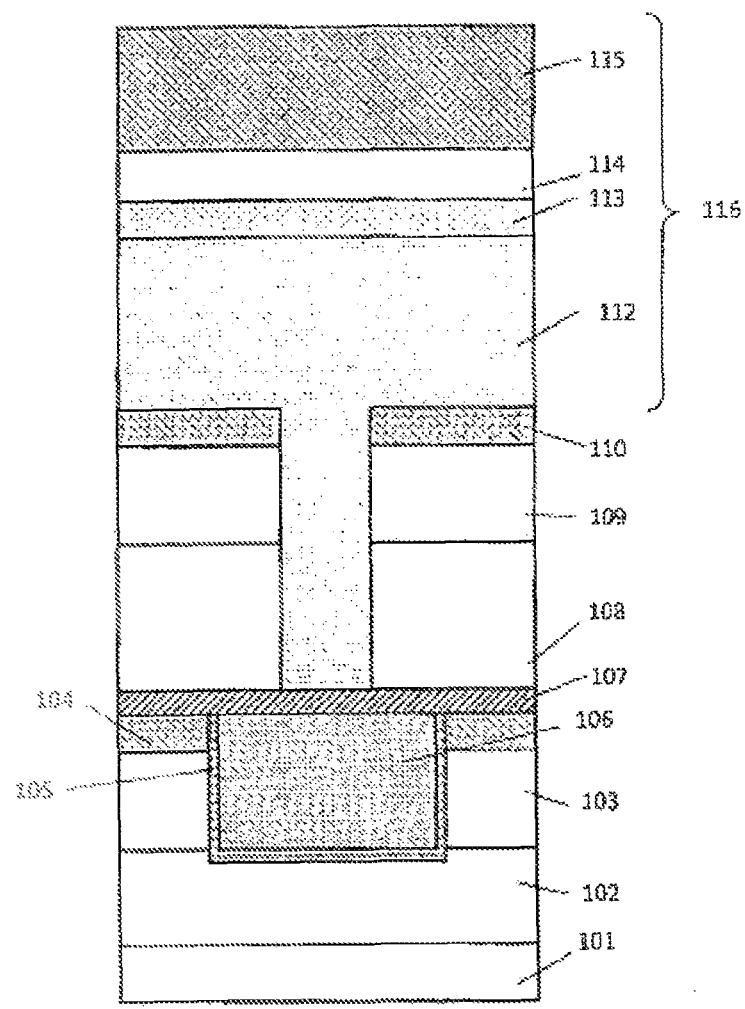
FIG. 2 is a cross section for explaining a method of fabricating the multi-layered interconnection layer arranged on the semiconductor substrate according to the present invention.

Next, as shown in FIG. 2, on a surface of the substrate including the interlayer insulating film that has the via holes which have been formed in part thereof, a multilayer resist structure 116, which comprises an SOC layer 112, an SOG layer 113, an $SiO_2$ layer 114 and a photo resist layer 115 superposed in this order from the semiconductor substrate 101 side, is deposited.

The via hole 112 is filled with the SOC layer 112, the SOC layer is deposited so that an upper surface of the SOC layer may become flat and smooth. The SOC layer 112 has a film thickness of, for example, 200 nm. By depositing the SOC layer 112 up to 200 nm, it is possible to make the via hole filled with the SOC layer 112 and to make the surface of the SOC layer smooth.

In order to make the $SiO_2$ layer 114 thin and to sufficiently suppress the evolution of the poisoning gas, it is preferable that the $SiO_2$ layer 114 is the high density $SiO_2$ layer whose density is 2.1 $g/cm^3$ or higher. It is possible to form the above-mentioned high density $SiO_2$ layer with the CVD method using the high density plasma whose electron density is $10^{10}$ electrons/$cm^3$ or higher. The high density plasma includes $SiH_4$ as the raw material of silane, $N_2O$ as the oxidizing gas, and Ar as the inert gas which is used for stabilizing the high density plasma. In this case, it is necessary to make a total of film thicknesses of the SOG layer 113 and the $SiO_2$ layer 114 thin in order to remove the SOG layer 113 and the $SiO_2$ layer 114 perfectly by carrying out the etching process while carrying out the etching process to the cap insulating film 110 and the interlayer insulating film 109 which will be mentioned later. Moreover, from a point of view of suppressing damage to the SOC layer at a time of forming the $SiO_2$ layer, and suppressing the evolution of the poisoning gas, the film thicknesses of the SOG layer 113 and the $SiO_2$ layer 114 are, for example, 40 nm and 60 nm respectively. It is necessary that the photo resist layer 115 remains as it is while carrying out the dry etching to the $SiO_2$ layer 114 and the SOG layer 113 which will be mentioned later, and the photo resist layer 115 is removed perfectly while carrying out the dry etching to the SOC layer 112. A film thickness of the photo resist layer 115 is, for example, 125 nm.

It is possible to form the SOG layer 113 by carrying out heat treatment after applying an organic silica raw material to the substrate which is rotated. A temperature in the heat treatment is, for example, 200° C. As a result, it is possible to form the SOG layer 113 on the SOC layer 112 without degrading the film quality of the SOC layer 112 which is a lower layer of the SOG layer 113. Moreover, it is possible to form the SOC layer 112 and the photo resist layer 115 with an application method which is used usually in the technical field.

Figure 3:
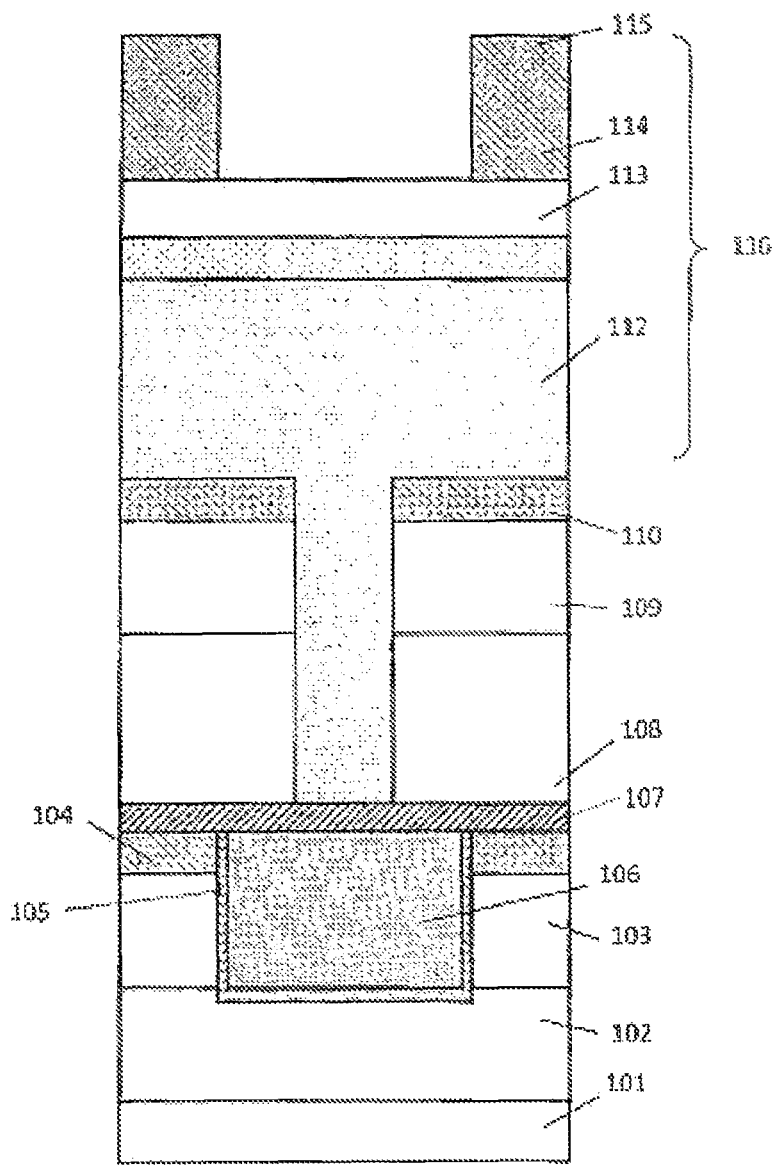
FIG. 3 is a cross section for explaining a method of fabricating the multi-layered interconnection layer arranged on the semiconductor substrate according to the present invention.

Next, as shown in FIG. 3, a desired wiring pattern is formed on the photo resist layer 115 by carrying out exposure process. It is possible to carry out the exposure process by use of the liquid immersion ArF exposure apparatus which is used usually.

Figure 4:
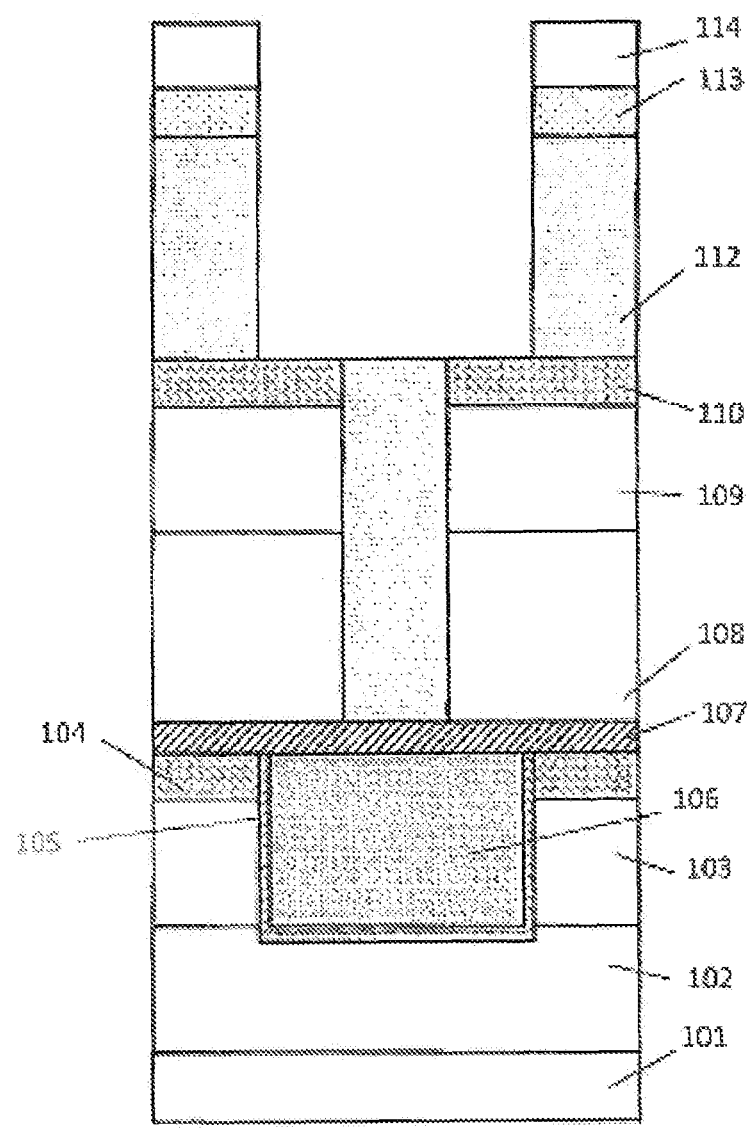
FIG. 4 is a cross section for explaining a method of fabricating the multi-layered interconnection layer arranged on the semiconductor substrate according to the present invention.
Figure 5:
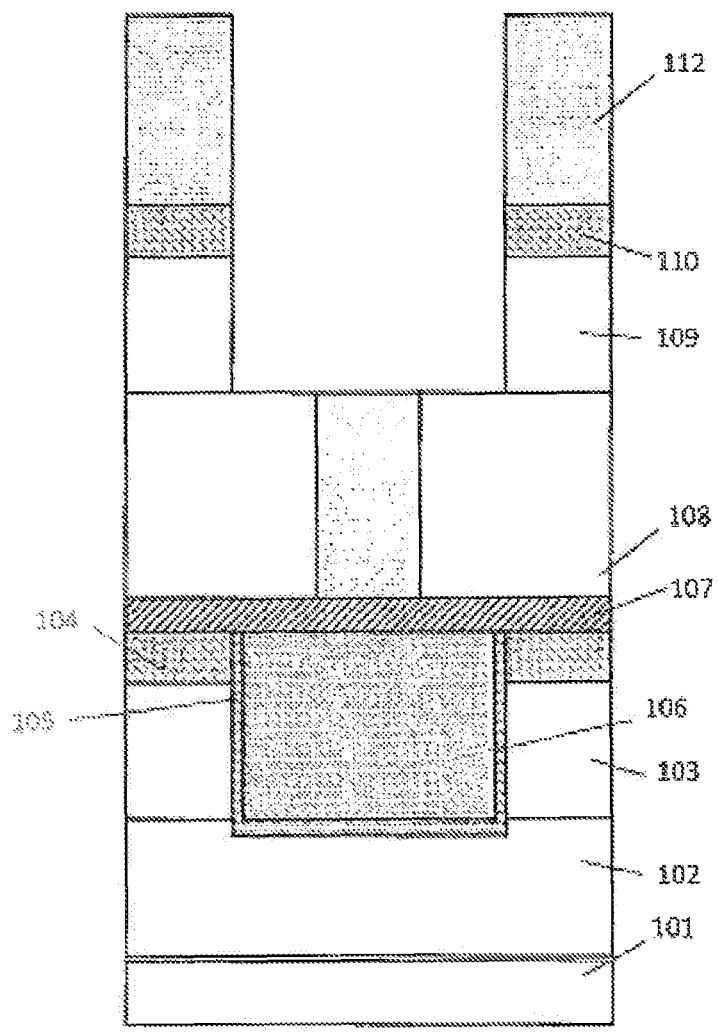
FIG. 5 is a cross section for explaining a method of fabricating the multi-layered interconnection layer arranged on the semiconductor substrate according to the present invention.

Next, as shown in FIG. 4, the anisotropic etching is carried out to the $SiO_2$ layer 114, the SOG layer 113 and the SOC layer 112 which are lower layers of the photo resist 115, by using the photo resist layer 115 as a mask. For example, plasma including $CF_4$ and Ar can be used for carrying out the dry etching to the $SiO_2$ layer 114 and the SOG layer 113. Moreover, for example, plasma including $O_2$ can be used for carrying out the dry etching to the SOC layer 112. By carrying out the dry etching process, it is possible to transcribe the wiring pattern, which is formed on the photo resist layer 115, to the $SiO_2$ layer 114, the SOG layer 113 and the SOC layer 112 which are lower layers of the photo resist layer 115. Moreover, it is preferable that the photo resist layer 115 is removed perfectly while carrying out the dry etching process.

Furthermore, the dry etching process continues for carrying out the anisotropic etching to the cap insulating film 110 and the interlayer insulating film 109, which are lower layers of the $SiO_2$ layer 114, the SOG layer 113 and the SOC layer 112, by using the $SiO_2$ layer 114, the SOG layer 113 and the SOC layer 112 as a mask. For example, plasma including $CF_4$ can be used for carrying out the dry etching to the cap insulating film 110 and the interlayer insulating film 109. It is possible to form a prescribed wiring pattern on the cap insulating film 110 and the interlayer insulating film 109 by carrying out the dry etching process. Moreover, it is preferable that the $SiO_2$ layer 114 and the SOG layer are removed perfectly while carrying out the dry etching process.

Figure 6:
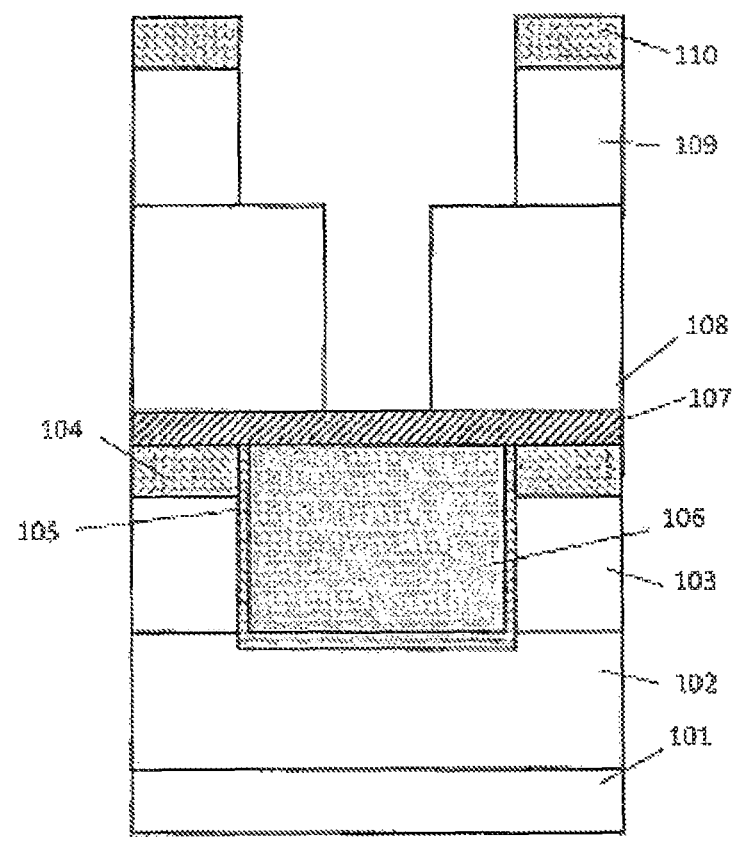
FIG. 6 is a cross section for explaining a method of fabricating the multi-layered interconnection layer arranged on the semiconductor substrate according to the present invention.
Figure 7:
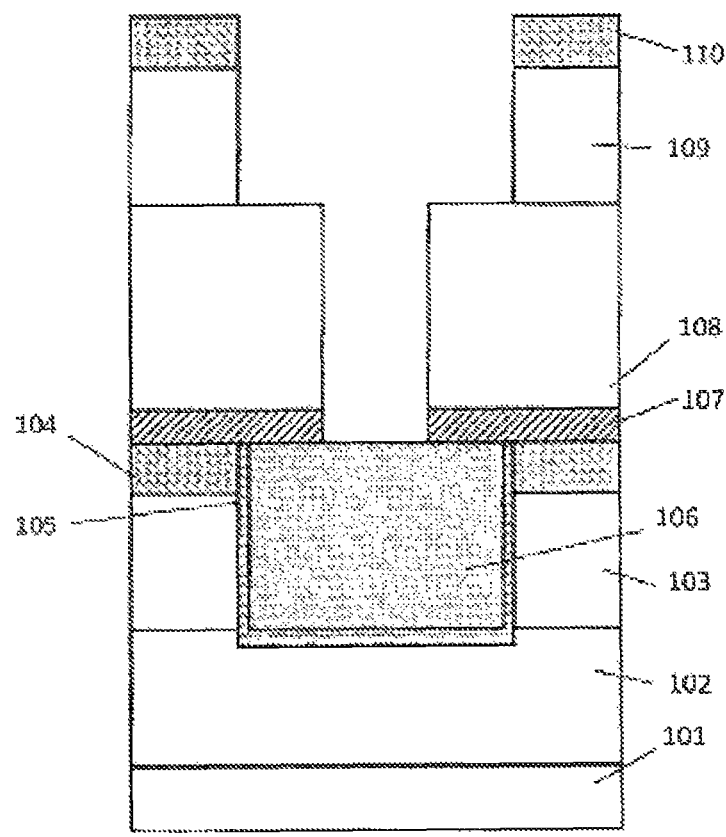
FIG. 7 is a cross section for explaining a method of fabricating the multi-layered interconnection layer arranged on the semiconductor substrate according to the present invention.

Next, as shown in FIG. 6, the SOC layer 112, which remains on the cap insulating film 110 and within the via hole 111, is removed by carrying out ashing process. $O_2$ plasma can be used in the ashing process. Meanwhile, in the case that the inter-via-layer insulating film 108 or the interlayer insulating film 109, which is exposed, is an SiOCH film, by using plasma including $H_2$ and He, it is possible to prevent deterioration in quality of the SiOCH film caused by the $O_2$ plasma.

Next, by carrying out the dry etching process to the barrier insulating film 107, which is exposed at the bottom of the via hole 111, by using the inter-via-layer insulating film as a mask, an opening part which reaches an upper surface of the first wiring 106 is formed in the barrier insulating film 107. In the case that the barrier insulating film 107 is an SiN film or an SiCN film, it is possible to carry out the dry etching by using the plasma including CF4.

Subsequently, by filling a wiring groove and the via hole 111 with a metal through a barrier metal 117, and removing the excessive metal to make a surface flat with CMP method, a via plug 118 and a second wiring 119 are formed simultaneously. A material of the second wiring 119 is, for example, copper. The barrier metal 117 is a conductive film having barrier properties of preventing a metal, included in the second wiring 119 and the via plug 118, from diffusing toward the inter-via-layer insulating film 108, the interlayer insulating film 109 and the cap insulating film 110. The barrier metal 117 covers side surfaces and bottom surfaces of the second wiring 119 and the via plug 118. When materials included in the second wiring 119 and the via plug 118 are metals whose main component is copper, laminated structure of the barrier metal 117 is, for example, TaN (film thickness 5 nm)/Ta (film thickness 5 nm).

Figure 8:
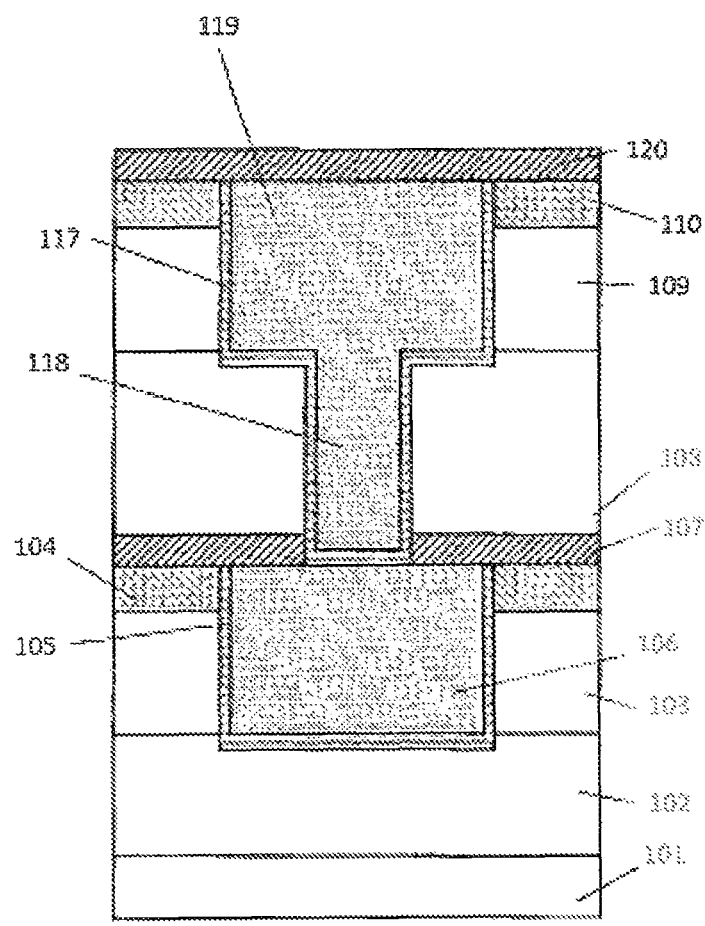
FIG. 8 is a partial cross section showing schematic structure of the multi-layered interconnection layer arranged on the semiconductor substrate according to the present invention.

Next, as shown in FIG. 8, a barrier insulating film 120 is formed on the cap insulating film 110 including the second wiring 119. The barrier insulating film 120 is, for example, an SiCN film whose film thickness is 50 nm.

By carrying out the wiring forming method of the present invention explained above, it is possible to improve a variation and a yield of electric properties of the wiring structure without depending on the structure of the wiring layer.

Second Exemplary Embodiment

In a second exemplary embodiment which uses the wiring forming method of the present invention, a two-terminal-type solid electrolyte switch element, which is an example of the functional elements and which is formed in the multi-layered interconnection layer arranged on the semiconductor substrate, and a fabrication method thereof will be explained in the following with reference to FIGS. 9 to 24.

Figure 9:
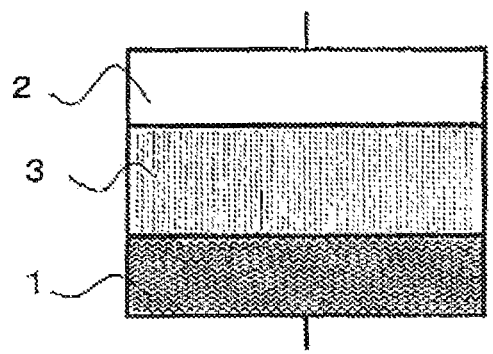
FIG. 9 is a schematic diagram showing a cross section of a resistance changing element.
Figure 10A:
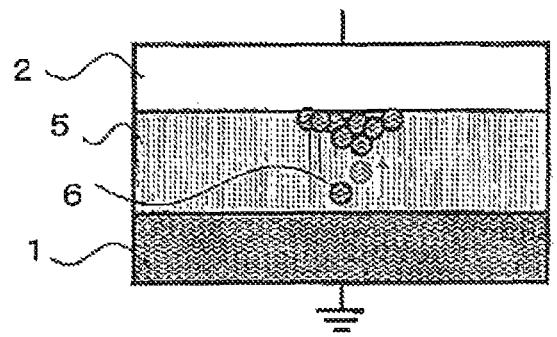
FIGS. 10(a), 10(b) and 10(c) are schematic diagrams for explaining an operation of a solid electrolyte switch element.
Figure 10B:
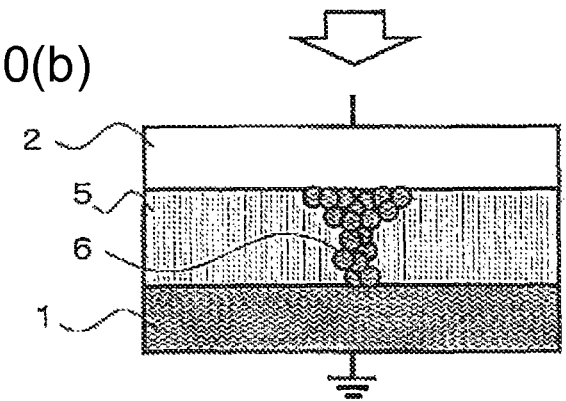

Firstly, operations of a resistance changing element and a solid electrolyte switch element, which is one of the resistance changing elements, will be explained briefly. FIG. 9 is a schematic diagram showing a cross section of the resistance changing element. The resistance changing element, which has three layers structure that a variable resistance layer 3 is interposed between a first electrode 1 (a lower electrode) and a second electrode 2 (an upper electrode), uses a phenomenon that a change in resistance is caused by applying a voltage between both electrodes. Each of FIG. 10 and FIG. 11 is a schematic diagram explaining an operation of the solid electrolyte switch element. When a negative voltage is applied to the second electrode 2 shown in FIG. 10(a), a metal atom 6 included in the first electrode 1 is ionized to be dissolved in a solid electrolyte 5, and then a metallic bridge is formed as shown in FIG. 10(b). The metallic bridge connects the first electrode 1 and the second electrode 2 electrically. As a result, the switch is changed to an ON state which indicates that resistance is low. The change in electric properties is shown on a right side of FIG. 11.

Figure 10C:
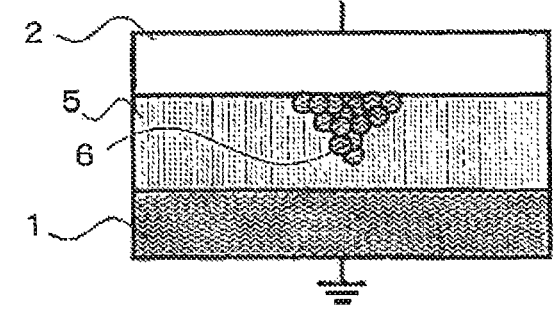
Figure 11:
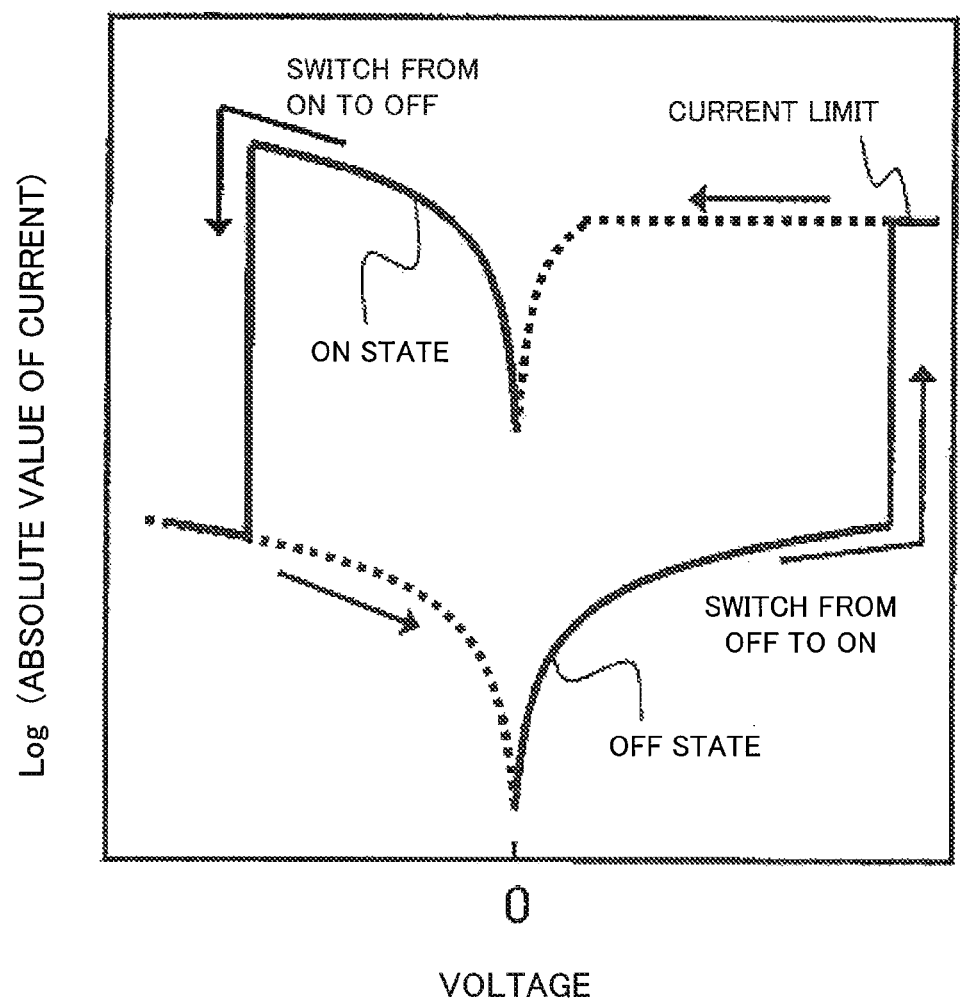
FIG. 11 is a diagram showing schematically current-voltage properties of the solid electrolyte switch element which is used as a resistance changing element.

Next, when applying a positive voltage to the second electrode 2 in the ON state, as shown in FIG. 10(c), the metallic bridge is dissolved in the solid electrolyte 5 to disconnect the first electrode 1 and the second electrode 2 electrically, and consequently the switch is changed to an OFF state which indicates that the resistance is high. The change in electric properties is shown on a left side of FIG. 11. The solid electrolyte switch element can carry out an operation of non-volatile and repeated switching between the ON state and the OFF state, and use of the properties enables application for a non-volatile memory or a non-volatile switch.

Figure 12:
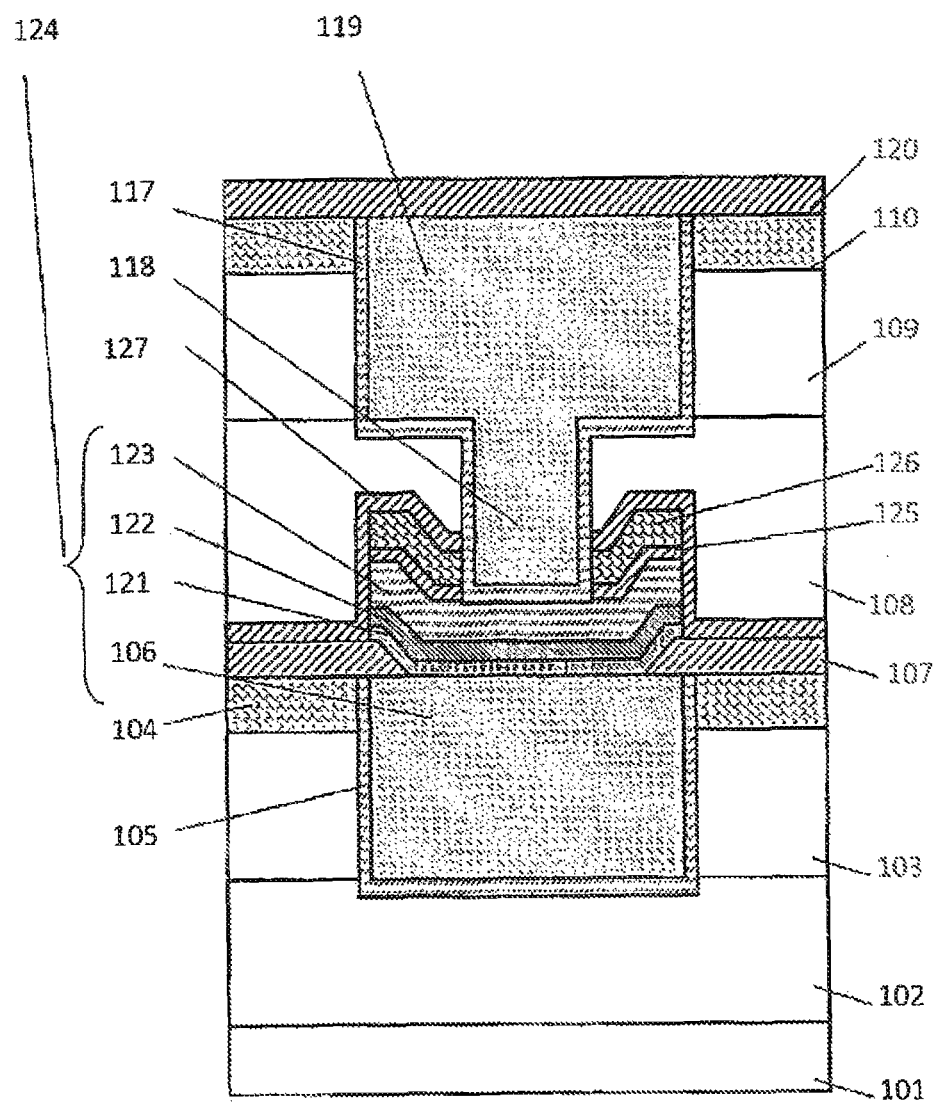
FIG. 12 is a cross section showing schematic structure of a two-terminal-type solid electrolyte switch element, which is formed in the multi-layered interconnection layer arranged on the semiconductor substrate, according to the present invention.

FIG. 12 is a partial cross section showing schematic structure of a two-terminal-type solid electrolyte switch element, which is formed in a multi-layered interconnection layer arranged on a semiconductor substrate, according to the present invention.

A solid electrolyte switch element 124, which is formed according to the exemplary embodiment, includes a first wiring 106, a solid electrolyte layer 121, a first upper electrode 122 and a second upper electrode 123.

Moreover, in the solid electrolyte switch element 124 which is formed according to the exemplary embodiment, a second hard mask film 125 and a third hard mask film 126 are formed on a lamination of the first upper electrode 122 and the second upper electrode 123. Side surfaces of the solid electrolyte layer 121, the first upper electrode 122, the second upper electrode 123, the second hard mask film 125 and the third hard mask film 126, and an upper surface of the barrier insulating film 107 are covered with a protective insulating film 127.

Similarly to the structure shown in FIG. 4 in the first exemplary embodiment, the first wiring 106 is a wiring embedded in a wiring groove, which is formed in the interlayer insulating film 103 and the cap insulating film 104, through the barrier metal 105. When the first wiring 106 is made of metallic materials whose main component is copper, in the solid electrolyte switch element 124, the first wiring 106 can be used as a lower electrode in order to ionize a copper atom included in the first wiring 106 and to dissolve the copper atom in the solid electrolyte layer 121. Accordingly, the solid electrolyte layer 121 and the first wiring are connected each other at an opening part of the barrier insulating film 107. In this case, it is preferable that width of the first wiring 106, which is connected with the solid electrolyte layer 121, is wider than a diameter of the opening part of the barrier insulating film 107.

Similarly to the structure shown in FIG. 4 in the first exemplary embodiment, the second wiring 119 also is a wiring embedded in a wiring groove, which is formed in the interlayer insulating film 109 and the cap insulating film 110, through the barrier metal 117. The second wiring 119 is united with the via plug 118. The via plug 118 is embedded in each of the via holes, which are formed in the inter-via-layer insulating film 108, the protective insulating film 127, the third hard mask film 126 and the second hard mask film 125, through the barrier metal 117. Moreover, the via plug 118 is connected with the second upper electrode 123 electrically through the barrier metal 117. Similarly to the first exemplary embodiment, the barrier metal 117 has laminated structure of, for example, TaN (film thickness 5 nm)/Ta (film thickness 5 nm).

From a point of view of lowering contact resistance, it is preferable that material of the barrier metal 117 is the same as the material of the second upper electrode 123. For example, when the barrier metal 117 has laminated structure of TaN (a lower layer)/Ta (an upper layer), it is preferable that TaN which is a material of the lower layer is used as a material of the second upper electrode 123.

The third hard mask film 126 is a film which is used as a hard mask when etching the second hard mask film 125. It is preferable that a kind of the second hard mask 125 is different from that of the third hard mask 126. For example, if the second hard mask film 125 is an SiCN film, it is possible to use an $SiO_2$ film as the third hard mask film 126.

The protective insulating film 127 is an insulating film which has a function without affecting damage to the solid electrolyte switch element 124 whose side surface is exposed, and furthermore to prevent that a component atom is diffused from the solid electrolyte switch element 124 to the inter-via-layer insulating film 108. For example, an SiN film, an SiCN film or the like can be used as the protective insulating film 127. It is preferable that a material of the protective insulating film 127 is the same as the material of the second hard mask film 125 and the barrier insulating film 107. Using the same material for the films, the protective insulating film 127, the barrier insulating film 107 and the second hard mask film 125 become united, and consequently adhesiveness between boundary surfaces is improved.

Next, a method of fabricating the two-terminal-type solid electrolyte switch element, which is shown in FIG. 12 and which is formed in the multi-layered interconnection layer arranged on the semiconductor substrate, will be explained with reference to FIGS. 13 to 24.

Moreover, each of FIGS. 13 to 24 is a diagram for explaining a method, with which the solid electrolyte switch element is fabricated and which uses the wiring forming method according to the second exemplary embodiment of the present invention, and shows a cross section of the element per a procedure of the fabrication.

Figure 13A:
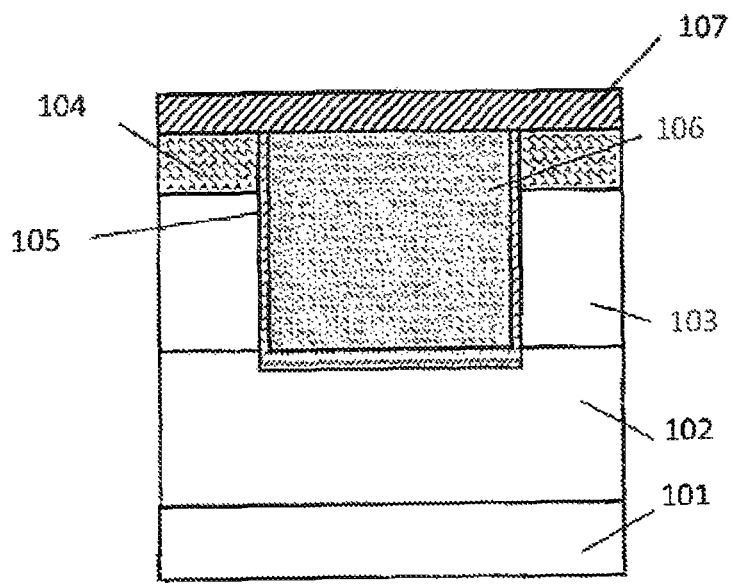
FIGS. 13(a) and 13(b) are cross sections for explaining a method of fabricating the solid electrolyte switch element shown in FIG. 12.

Firstly, as shown in FIG. 13(a), structure of the substrate on which the copper wiring is formed is the same partially as the structure which is shown in FIG. 4 for explaining the first exemplary embodiment. That is, the structure includes the semiconductor substrate 101, the interlayer insulating film 102, the interlayer insulating film 103, the cap insulating film 104, the barrier metal 105, the first wiring 106 and the barrier insulating film 107. For example, the interlayer insulating film 102 is a silicon oxide film whose film thickness is 300 nm, and the interlayer insulating film 103 is an SiOCH film whose film thickness is 150 nm, and the cap insulating film 104 is a silicon oxide film whose film thickness is 100 nm. Laminated structure of the barrier metal 105 is, for example, TaN (film thickness 5 nm)/Ta (film thickness 5 nm). A material of the first wiring 106 is, for example, copper. The barrier insulating film 107 is, for example, an SiCN film whose film thickness is 30 nm.

Figure 13B:
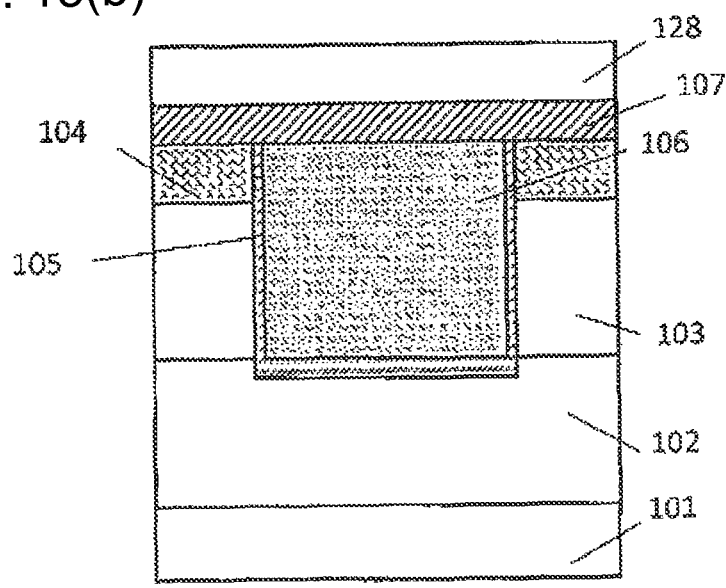
Figure 14A:
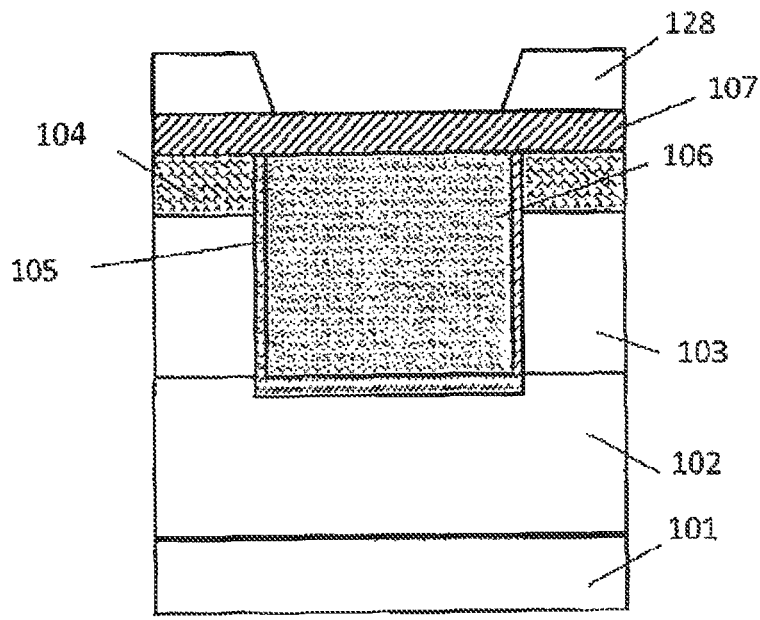
FIGS. 14(a) and 14(b) are cross sections for explaining a method of fabricating the solid electrolyte switch element shown in FIG. 12.
Figure 14B:
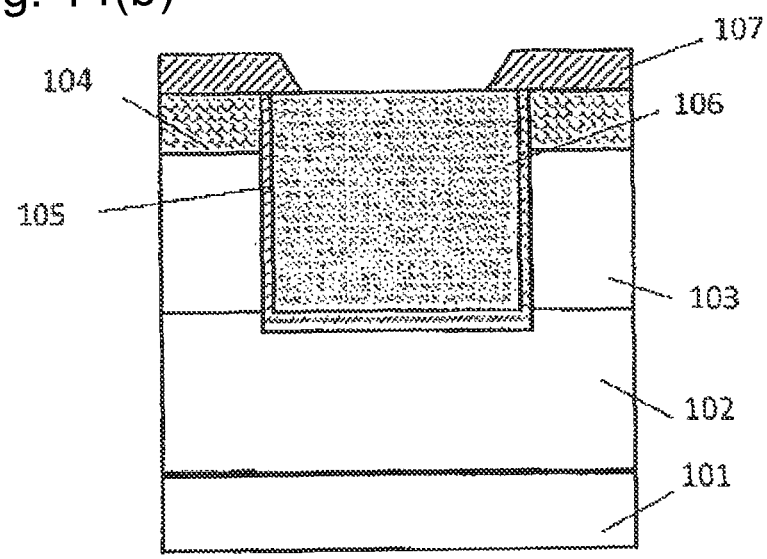

A first hard mask film 128 is formed on the barrier insulating film 107 arranged over the substrate which is included in the structure shown in FIG. 13(a) (FIG. 13(b)). From a point of view that an etching selectivity in the dry etching process is kept large, it is preferable that a material of the first hard mask film 128 is different from that of the barrier insulating film 107. The first hard mask film 128 may be an insulating film or may be a conductive film. For example, a silicon oxide film, TiN, Ti, Ta, TaN or the like can be used. In this case, for example, a silicon oxide film is used as the first hard mask film 128.

Next, a photo resist (not shown in the drawing) which has a prescribed opening part pattern is formed on the first hard mask film 128, and the dry etching is carried out by using the photo resist as a mask to transcribe the opening part pattern onto the first hard mask film 128. Subsequently, the photo resist is exfoliated with the oxygen plasma ashing method or the like (FIG. 14(a)).

Next, the etchback (in this case, reactive dry etching is used) is carried out to the barrier insulating film 107 which is exposed at the opening part of the first hard mask film 128 by using the first hard mask film 128 as a mask. As a result, an opening part, which reaches an upper surface of the first wiring 106, is formed in the barrier insulating film 107. The first hard mask film 128 is removed by the etching while carrying out the etchback. After the opening part is formed, a natural oxide film and an etching by-product, which are formed on the first wiring 106 existing in the opening part, are removed by using an organic solvent or by carrying out a plasma radiating process using gas including $H_2$ or an inert gas, and consequently a clean copper surface is acquired in the opening part (FIG. 14(b)). Processes of forming the structure shown in an order of FIG. 13(a) to FIG. 14(b) are referred to as a process A1.

In the process A1, it is possible to carry out the reactive dry etching, which is carried out when forming the opening part of the barrier insulating film 107, on the condition that a gas flow rate of $CF_4/Ar$ is 25/50 sccm, and a pressure is 0.53 Pa, and a source power is 400 W, and a substrate bias power is 90 W. By lowering the source power or by making a substrate bias large, it is possible to improve ionization at a time of etching and to make an angle of a tapered form of the barrier insulating film 107 small. In this case, it is possible to carry out the etching, whose depth is approximately 35 nm (corresponding to over-etching of approximately 80%), to a residual film which exists at a bottom of the opening part of the barrier insulating film 107.

Moreover, in the process A1, the reactive dry etching and the reactive etchback, which are carried out when forming the opening part of the barrier insulating film 107, may be carried out in an atmosphere of reducing pressure and on the condition of heating the substrate at 350° C. In the case that the etchback is carried out by a sputtering apparatus, it is possible to heat the substrate by use of a heat chamber which is installed in the sputtering apparatus.

Moreover, in the process A1, when the etchback is carried out with the RF etching process which uses an inert gas, it is possible to carry out the RF etching process, which uses the inert gas, in an RF etching chamber using Ar gas on the condition that Ar gas flow rate is 30 sccm, and a pressure is 1.3 Pa, and a source power is 290 W, and a substrate bias power is 130 W. It is possible to quantify an RF etching time on the basis of an etching volume of an $SiO_2$ film which is formed with plasma-enhanced CVD method. For example, it is possible to determine that the RF etching time is 3 nm in terms of the $SiO_2$ film.

Moreover, in the process A1, in the case of removing a natural oxide film and an etching by-product, which are formed on a surface of the copper wiring existing in the opening part, by carrying out the reducing plasma radiating process using a reducing gas. It is possible to carry out the removal in an etching processing room, which has a cooling mechanism, by use of $H_2$ gas and He gas which is the inert gas on the condition that a $H_2$ gas flow rate is 100 sccm, and a He gas flow rate is 100 sccm, and a pressure is 800 mTorr, and an RF power is 1000 W. A temperature of the substrate may be lowered in order to suppress increase in roughness of the surface of the copper wiring existing in the opening part. For example, it is possible to carry out the reducing plasma radiating process at the substrate temperature of −20° C.

Next, the solid electrolyte layer 121 is deposited on the barrier insulating film 107 including the opening part in which the first wiring 106 is exposed. A metal oxide film which includes, at least, one out of Ta, Ni, Ti, Zr, Hf, Si, Al, Fe, V, Mn, Co and W, an SiOCH film, a chalcogenide film, lamination including these films, or the like can be used as the solid electrolyte layer 121. For example, an SiOCH film whose film thickness is 6 nm is used. In this case, the SiOCH film is deposited with the plasma-enhanced CVD method, and continuously an inert plasma process is carried out. Next, the first upper electrode 122 and the second upper electrode 123 are formed on the solid electrolyte layer 121 in this order with sputtering method (FIG. 15(*a*)). It is preferable to use a metal, which is inert chemically and to which the dry etching process is carried out easily, as the first upper electrode 122. Such the metal is, for example, Ru. Moreover, from a point of view of preventing a metal composing the second upper electrode, which is a lower layer, from being diffused into the via plug 118 with which the second upper electrode 123 is connected electrically through the barrier metal 117, it is preferable that the second upper electrode 123 is made of a conductive material which has strong barrier capability. Furthermore, in order to lower contact resistance, it is preferable that a material of the second upper electrode 123 is the same as the material of the barrier metal 117. Accordingly, for example, TaN is used in the present exemplary embodiment.

Figure 15A:
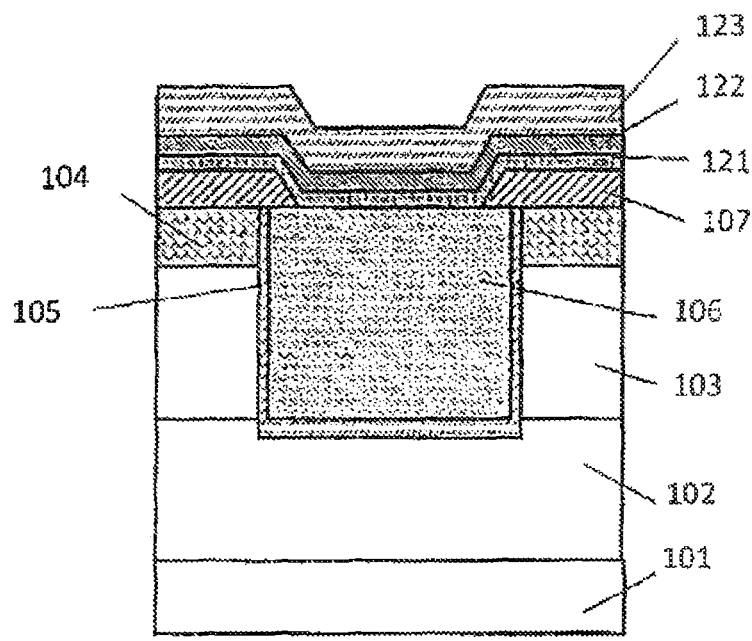
FIGS. 15(a) and 15(b) are cross sections for explaining a method of fabricating the solid electrolyte switch element shown in FIG. 12.
Figure 15B:
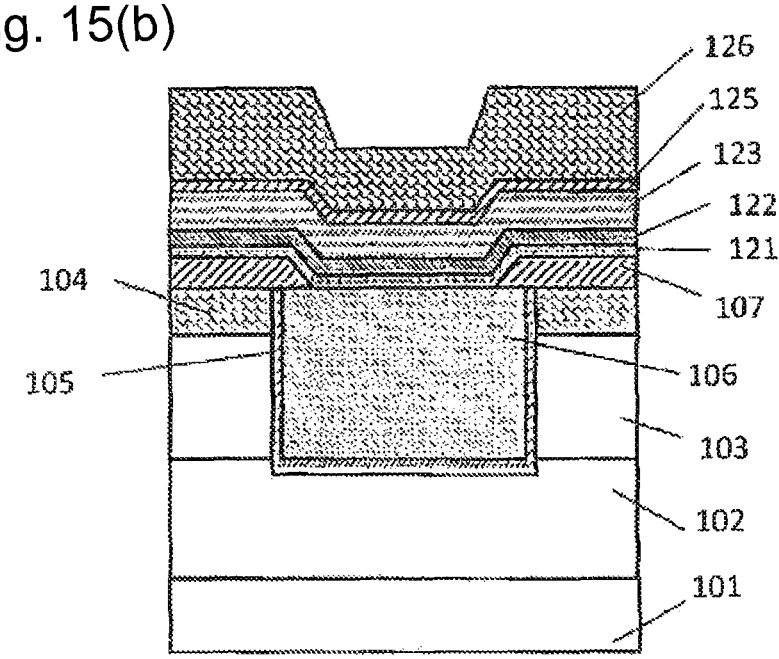

Next, the second hard mask film 125 and the third hard mask film 126 are superposed on the second upper electrode 123 in this order (FIG. 15(*b*)). From a point of view of adhesiveness, it is preferable that the second hard mask film 125 uses the same material as that of the barrier insulating film 107. For example, the second hard mask film 125 is, for example, an SiCN film whose film thickness is 30 nm. The third hard mask 126 is, for example, an $SiO_2$ film whose film thickness is 100 nm.

Processes of forming the structure shown in FIG. 14(*b*) up to forming the structure shown in FIG. 15(*b*) are referred to as a process A2.

In the process A2, when an SiOCH film is used as the solid electrolyte layer 121, according to the plasma-enhanced CVD method, by using a liquid SiOCH monomer molecule as a raw material and setting a condition that a substrate temperature is 400° C. or lower, and a He flow rate is 500 to 2000 sccm, and a flow rate of raw material is 0.1 to 0.8 g/min, and a chamber pressure of the plasma-enhanced CVD is 2.7 to 4.2 Torr and an RF power is 20 to 100 W, it is possible to deposit the solid electrolyte layer 121. Specifically, it is possible to deposit the solid electrolyte layer 121 on the condition that the substrate temperature is 350° C., and the He flow rate is 1500 sccm, and the flow rate of raw material is 0.75 g/min, and the chamber pressure of plasma-enhanced CVD is 3.5 Torr and the RF power is 50 W.

After depositing the solid electrolyte layer 121, it is possible to carry out the inert plasma process by using He as the inert gas and setting a condition that a substrate temperature is than 400° C. or lower, and a He flow rate is 500 to 1500 sccm, and a plasma chamber pressure is 2.7 to 3.5 Torr, and an RF power is 20 to 200 W. Specifically, the inert plasma process is carried out on the condition that the substrate temperature is 350° C., the He flow rate is 1000 sccm, the plasma chamber pressure is 2.7 Torr, the RF power is 50 W, and a process time is 30 seconds. By carrying out the inert plasma process, it is possible to improve adhesiveness between the solid electrolyte layer 121 and the first upper electrode 122 which will be deposited in a next step.

Moreover, in the process A2, it is possible to deposit the first upper electrode 122, whose film thickness is 10 nm, with the DC sputtering method, whose target metal is Ru, on the condition that a substrate temperature is a room temperature, and a sputter power is 0.2 kW, and an Ar flow rate is 20 sccm, and a pressure is 0.27 Pa. Similarly, it is possible to deposit the second upper electrode 123, whose film thickness is 30 nm, with the DC sputtering method, whose target metal is Ta, on the condition that a substrate temperature is a room temperature, and a sputter power is 0.2 kW, and an Ar flow rate is 20 sccm, and an $N_2$ flow rate is 15 sccm and a pressure is 0.27 Pa.

Moreover, it is possible to form the second hard mask film 125 and the third hard mask film 126 with the plasma-enhanced CVD method. It is possible to form the second hard mask film 125 and the third hard mask film 126 with the plasma-enhanced CVD method which is used usually in the technical field. It is possible to select a temperature, which is used for forming the mask film, within a range from 200 to 400° C. In this case, the deposition temperature of 350° C. is selected.

Figure 16A:
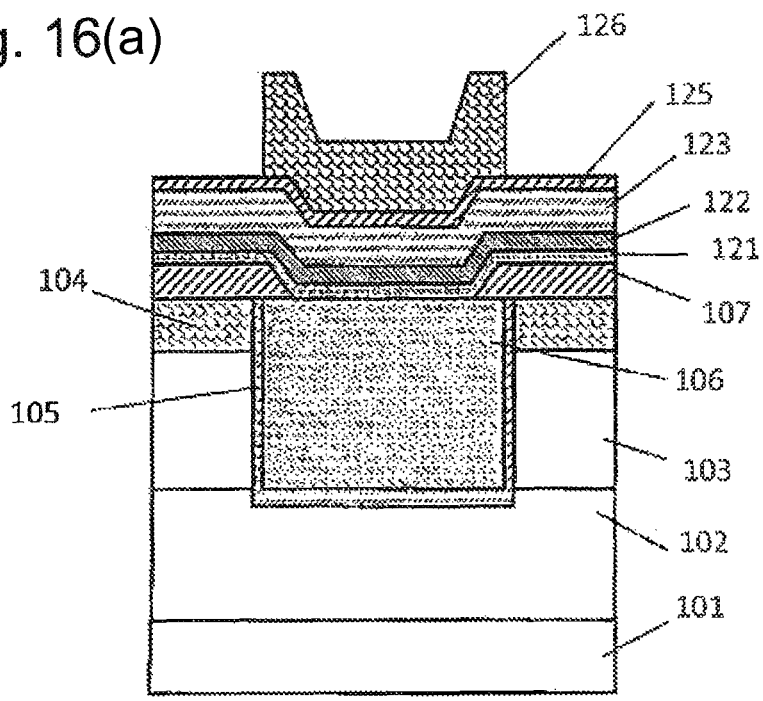
FIGS. 16(a) and 16(b) are cross sections for explaining a method of fabricating the solid electrolyte switch element shown in FIG. 12.
Figure 16B:
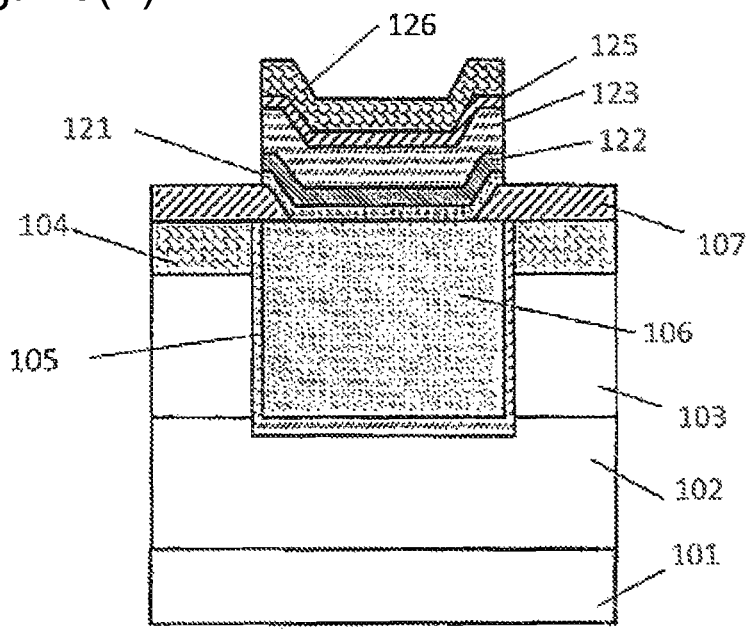

Next, a pattern of the third hard mask film 126, which is used for forming the solid electrolyte switch element 124 which is a lower layer, is formed by carrying out the lithography and the dry etching (FIG. 16(*a*)). Subsequently, the dry etching is carried out continuously to the second hard mask film 125, the second upper electrode 123, the first upper electrode 122 and the solid electrolyte layer 121, by using the third hard mask film 126 as a mask (FIG. 16(*b*)). Processes of forming the structure shown in FIG. 15(*b*) up to forming the structure shown in FIG. 16(*a*) are referred to as a process A3.

In the process A3, it is preferable that the dry etching of the third hard mask film 126 is carried out up to an upper surface or an inside of the second hard mask film 125. In this case, since the solid electrolyte layer 121 is covered with the second hard mask film 125, the solid electrolyte layer 121 is not exposed to the oxygen plasma. Moreover, since Ru of the first upper electrode 122 is not exposed to the oxygen plasma, it is possible to suppress that the side etch is caused in the first upper electrode 122. Here, parallel-plate type dry etching apparatus, which is normally used, can be used for the dry etching of the third hard mask film 126.

In the process A3, each etching of the second hard mask film 125, the second upper electrode 123, the first upper electrode 122 and the solid electrolyte layer 121 can be carried out by the parallel-plate type dry etching apparatus. It is possible to carry out the etching to the second hard mask film 125 (for example, an SiCN film) on the condition that a gas flow rate of $CF_4/Ar$ is 25/50 sccm, and a pressure is 0.53 Pa, and a source power is 400 W, and a substrate bias power is 90 W.

Moreover, it is possible to carry out the etching to the second upper electrode 123 (for example, TaN) on the condition that a substrate temperature is 90° C., a $Cl_2$ gas flow rate is 50 sccm, a pressure is 0.53 Pa, a source power is 400 W, and a substrate bias power is 60 W.

Moreover, it is possible to carry out the etching to the first upper electrode 122 (for example, Ru) on the condition that a substrate temperature is a room temperature, an $O_2$ gas flow rate is 160 sccm, a pressure is 0.53 Pa, a source power is 300 W, and a substrate bias power is 100 W.

Moreover, it is possible to carry out the etching to the solid electrolyte layer 121 (for example, SiOCH) on the condition that a substrate temperature is a room temperature, a flow rate of $CF_4$ is 15 sccm, a flow rate of Ar is 15 sccm, a pressure is 0.53 Pa, a source power is 600 W, and a substrate bias power is 100 W.

Moreover, in the process A3, each etching of the second hard mask film 125, the second upper electrode 123, the first upper electrode 122 and the solid electrolyte layer 121 can be carried out by the parallel-plate type dry etching apparatus on the above-mentioned condition.

Moreover, in the process A3, it is possible to obtain a remaining film thickness of the third hard mask film 126 to be 50 nm, after completing each etching of the second hard mask film 125, the second upper electrode 123, the first upper electrode 122 and the solid electrolyte layer 121 by the above-mentioned condition.

Figure 17:
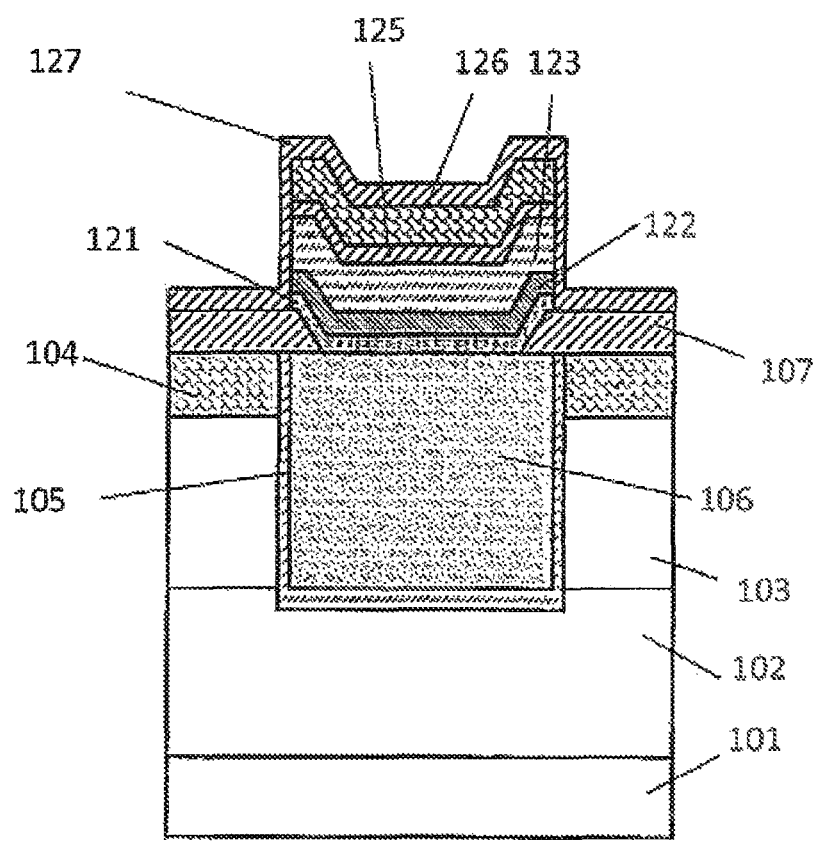
FIG. 17 is a cross section for explaining a method of fabricating the solid electrolyte switch element shown in FIG. 12.
Figure 18:
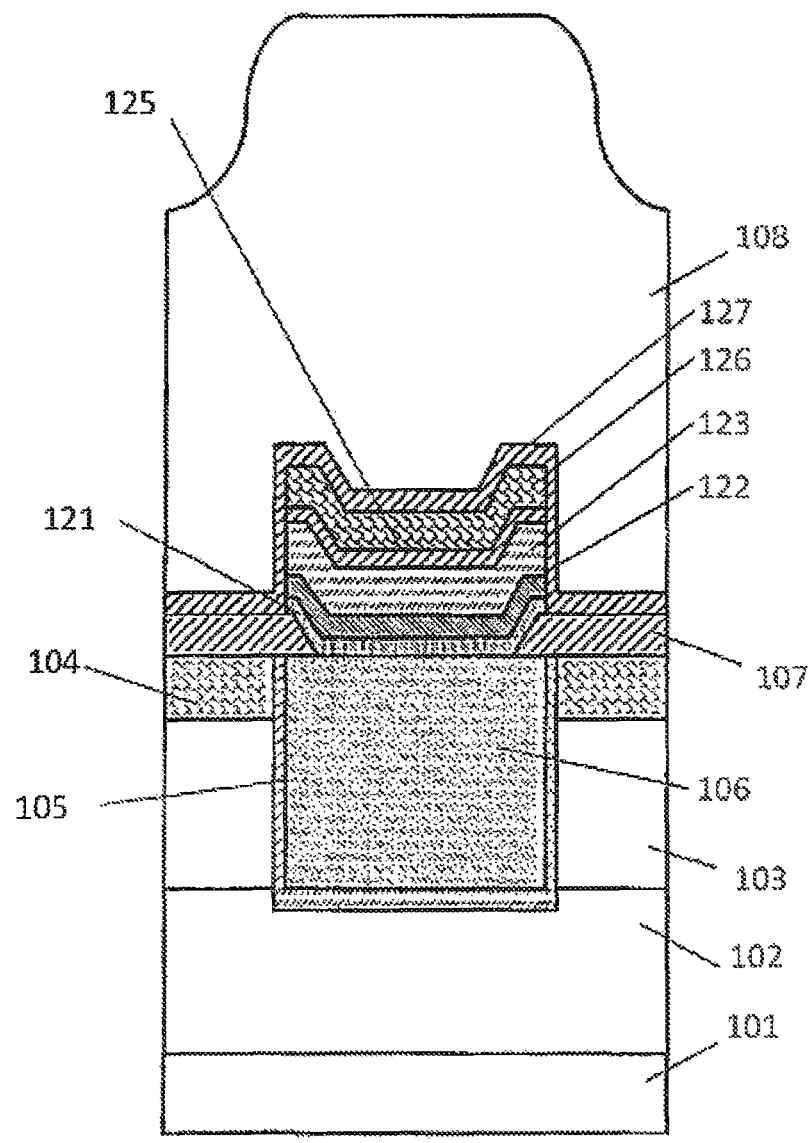
FIG. 18 is a cross section for explaining a method of fabricating the solid electrolyte switch element shown in FIG. 12.
Figure 19:
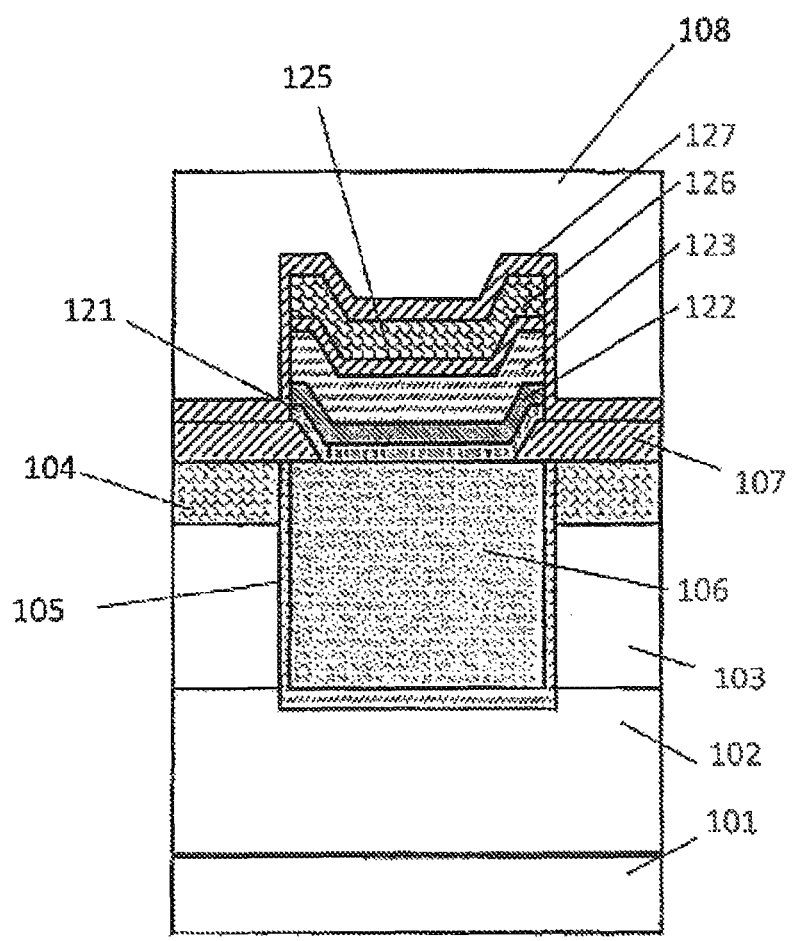
FIG. 19 is a cross section for explaining a method of fabricating the solid electrolyte switch element shown in FIG. 12.

Next, the protective insulating film 127 is deposited on the laminated structure which includes the third hard mask film 126, the second hard mask film 125, the second upper electrode 123, the first upper electrode 122, the solid electrolyte layer 121 and the barrier insulating film 107 (FIG. 17). It is preferable that a material of the protective insulating film 127 is the same as the material of the barrier insulating film 107 and the second hard mask film 125. For example, an SiCN film whose film thickness is 30 nm is used as the protective insulating film 127. The inter-via-layer insulating film 108 is deposited continuously on the protective insulating film 127 with the plasma-enhanced CVD method (FIG. 18). The inter-via-layer insulating film 108 is, for example, an $SiO_2$ film whose film thickness is 300 nm. Next, the inter-via-layer insulating film 108 is made flat by use of the CMP method (FIG. 19). Processes of forming the structure shown in FIG. 16(*b*) up to forming the structure shown in FIG. 19 are referred to as a process A4.

In the process A4, when, for example, an SiCN film is used as the protective insulating film 127, it is possible to form the SiCN film with the plasma-enhanced CVD method, whose raw material gases are tetramethyl-silane and ammonia, on the condition that a substrate temperature of is 350° C. By forming the protective insulating film 127, periphery of the resistance changing element is protected by the same material of SiCN film, since the same material are selected for the barrier insulating film 107, the protective insulating film 127 and the second hard mask film 125 over the first wiring 106. As a result, it is possible to improve adhesiveness between the boundary surfaces, and to improve moisture absorption properties, water-resistant properties and oxygen desorption immunity, and consequently to improve yield and reliability of the element.

Moreover, in the process A4, in the case that inter-via-layer insulating film 108 is made flat with the CMP method, by shaving the inter-via-layer insulating film 108 off by approximately 150 nm from a top surface, it is possible to make a film thickness of the residual film approximately 150 nm. In this case, when the CMP method is applied to the inter-via-layer insulating film 108, it is possible to carry out a polish by use of colloidal silica or ceria-based slurry.

Figure 20:
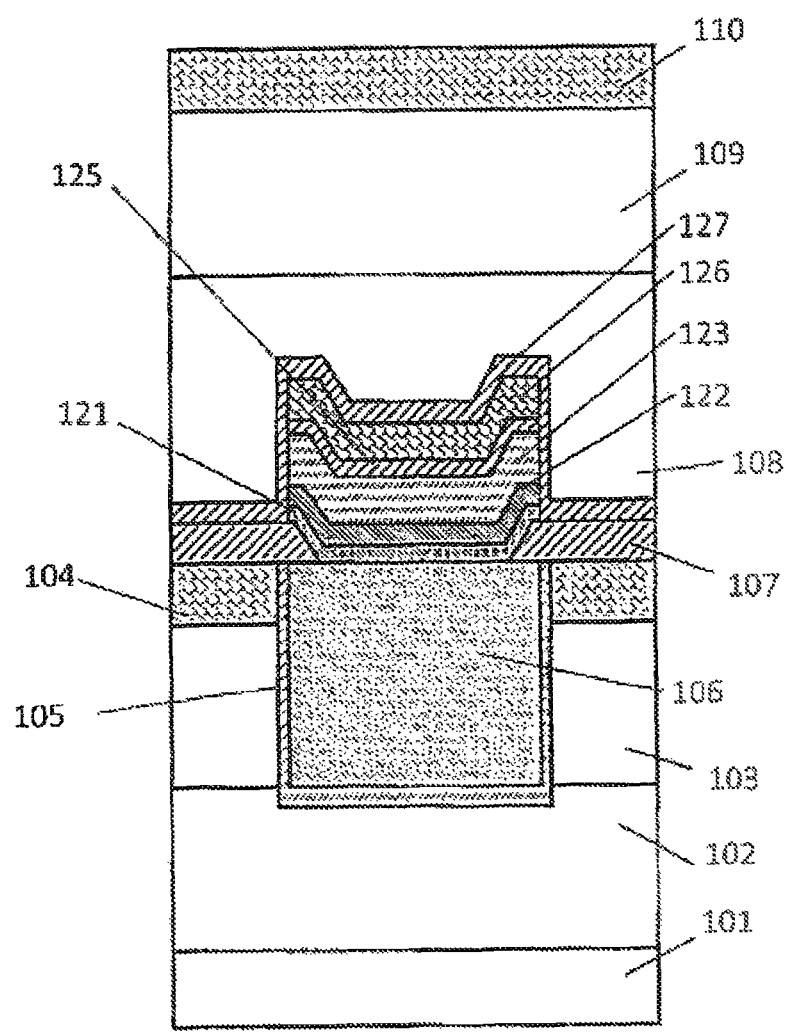
FIG. 20 is a cross section for explaining a method of fabricating the solid electrolyte switch element shown in FIG. 12.

The interlayer insulating film 109 and the cap insulating layer are deposited in this order on the inter-via-layer insulating film 108 whose upper surface is made flat (FIG. 20). In order to make the inter-via-layer insulating film 108, which comes into contact with a lower part of the interlayer insulating film 109, the etching stopper layer, the interlayer insulating film 109 uses a material different from the material of inter-via-layer insulating film 108. For example, the interlayer insulating film 109 is an SiOCH film whose film thickness is 150 nm. Processes of forming the structure shown in FIG. 19 up to forming the structure shown in FIG. 20 are referred to as a process A5.

In the process A5, it is possible to deposit the interlayer insulating film 109 and the cap insulating film 110 with the plasma-enhanced CVD method.

Figure 21:
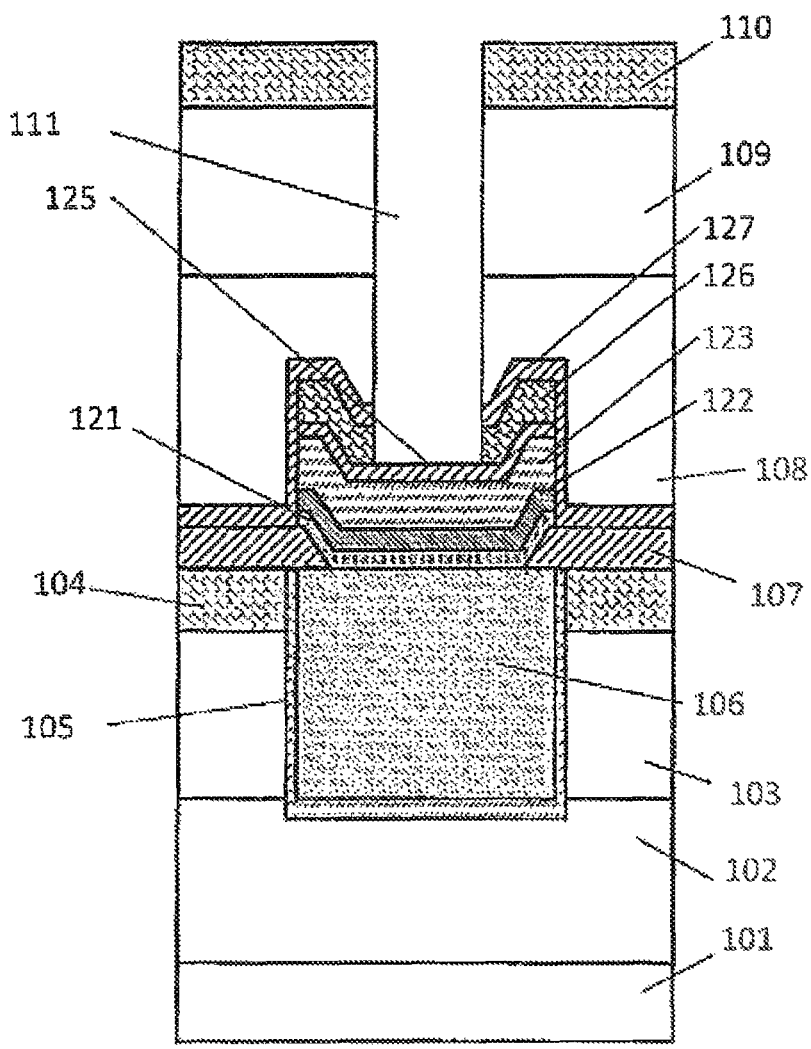
FIG. 21 is a cross section for explaining a method of fabricating the solid electrolyte switch element shown in FIG. 12.

Next, as shown in FIG. 21, over the solid electrolyte switch element 124, the via hole 11, which penetrates the cap insulating film 110, the interlayer insulating film 109, the inter-via-layer insulating film 108, the protective insulating film 127 and the third hard mask 126 in this order from a top and at whose bottom the second hard mask 125 is exposed, is formed by carrying out the lithography and the dry etching. Processes of forming the structure shown in FIG. 20 up to forming the structure shown in FIG. 21 are referred to as a process A6.

In the process A6, by adjusting an etching condition and an etching time of the dry etching to form the via hole 111, it is possible to stop etching at an upper surface or the inside of the second hard mask film 125. It is preferable to make a diameter of the bottom of the via hole 111 smaller than a diameter of the opening part of the barrier insulating film 107. In the exemplary embodiment, it is assumed that the diameter of the bottom of the via hole 111 is 60 nm, and the diameter of the opening part of the barrier insulating film 107 is 100 nm.

Figure 22:
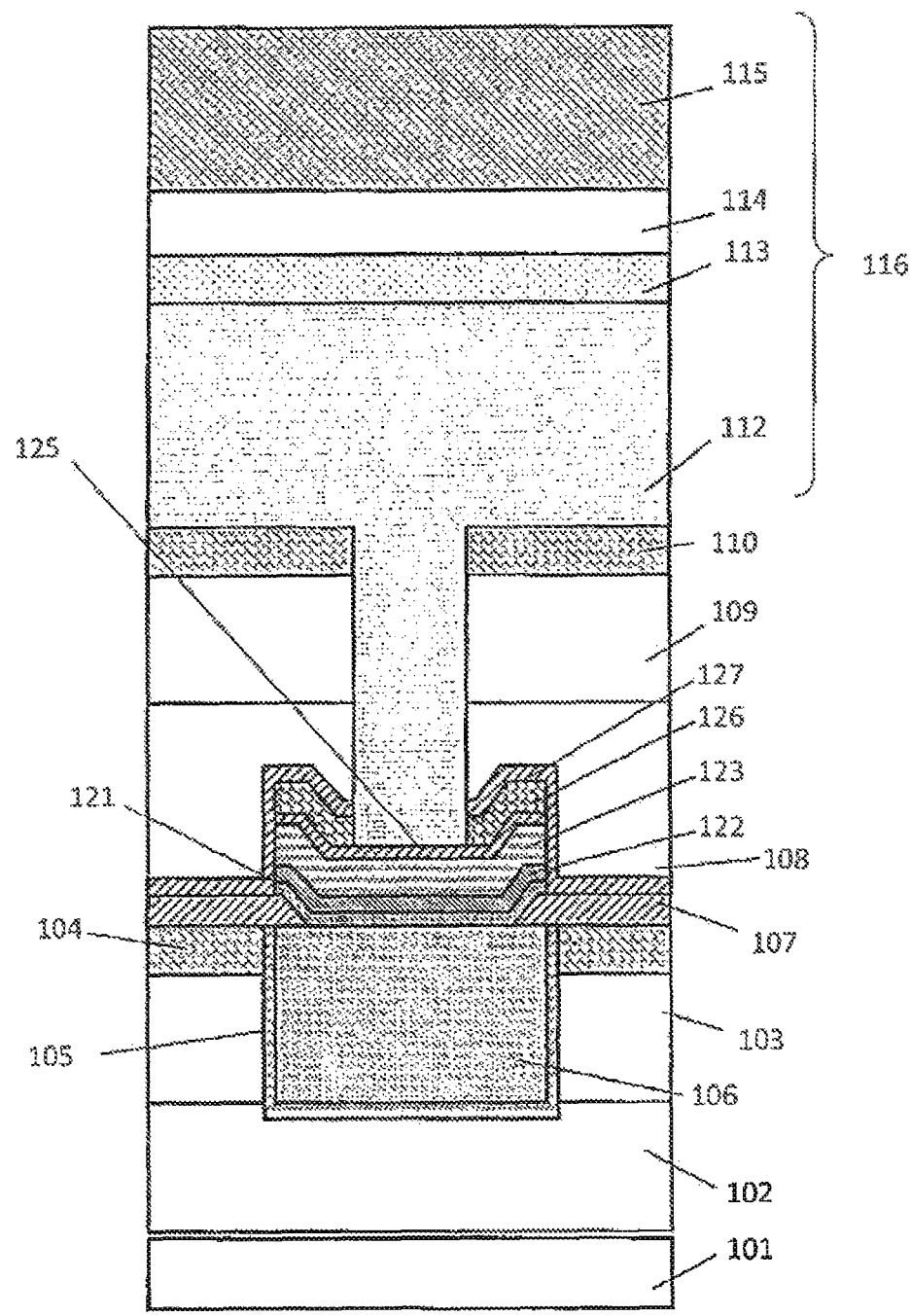
FIG. 22 is a cross section for explaining a method of fabricating the solid electrolyte switch element shown in FIG. 12.
Figure 23:
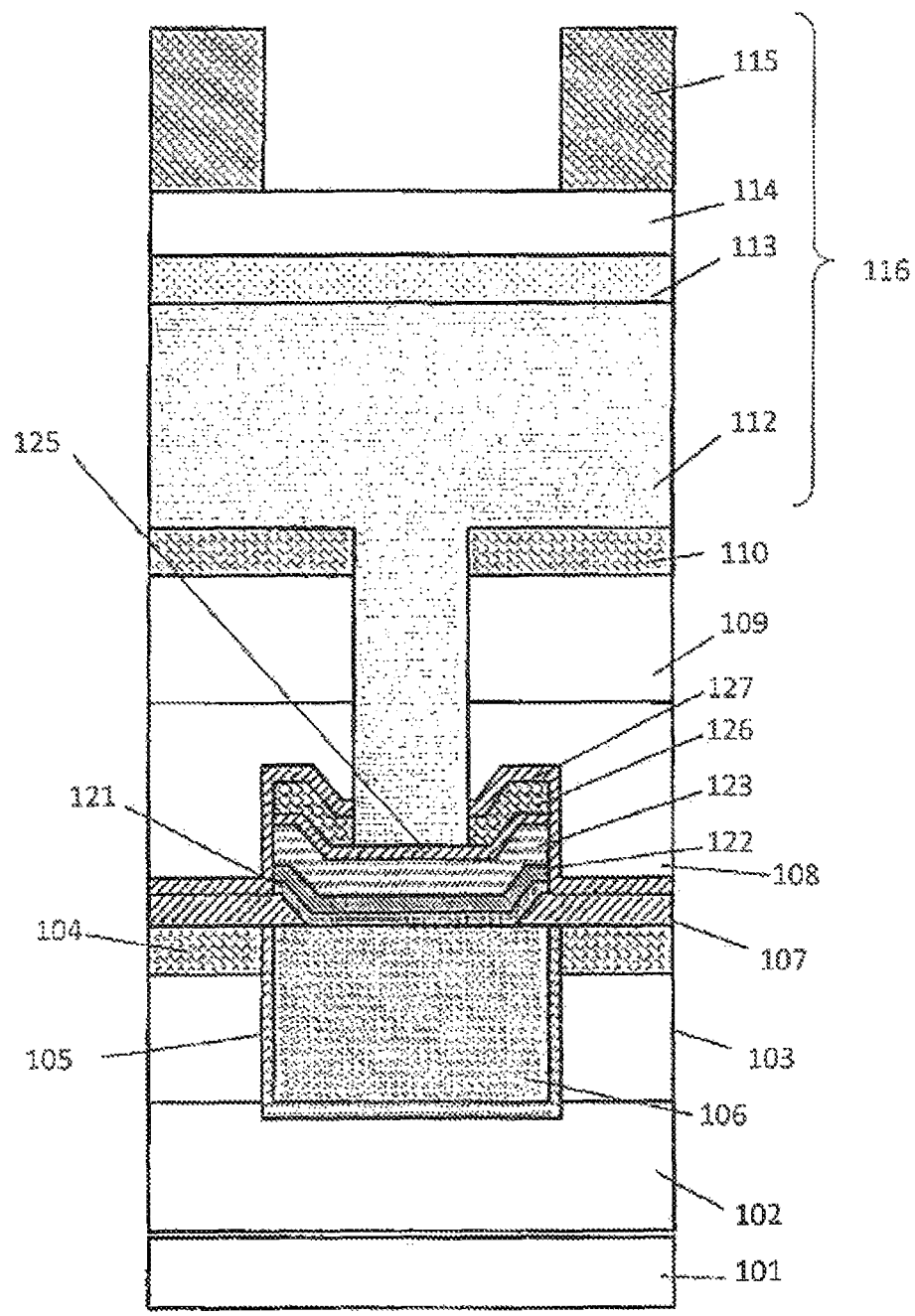
FIG. 23 is a cross section for explaining a method of fabricating the solid electrolyte switch element shown in FIG. 12.

Next, the multilayer resist structure is formed by depositing the SOC layer 112, the SOG layer 113, the $SiO_2$ layer 114 and the photo resist layer 115 in this order on the basis of the wiring forming method according to the present invention as shown in FIG. 22. As shown in FIG. 23, a desired wiring pattern is formed on the photo resist layer 115 by carrying out the exposure process after depositing the multilayer resist structure. It is possible to carry out the exposure process, for example, by using the liquid immersion ArF exposure apparatus which is used usually. By carrying out the method, it is possible to suppress the evolution of the poisoning gas from the second upper electrode (TaN in the present exemplary embodiment) or the second hard mask film 125 which is a lower layer, and to form a desired wiring pattern on the photo resist layer 115. Processes of forming the structure shown in FIG. 21 up to forming the structure shown in FIG. 23 are referred to as a process A7.

In the process A7, the via hole 111 is filled with the SOC layer 112, and furthermore the SOC layer 112 is deposited so that an upper surface of the SOC layer 112 may be flat and smooth. The SOC layer has a film thickness of, for example, 200 nm.

Moreover, in the process A7, the $SiO_2$ layer 114 is a high density $SiO_2$ layer, which is formed with the CVD method using the high density plasma having the electron density of than $10^{10}$ electrons/cm$^3$ or higher, and whose density is 2.1 g/cm$^3$ or higher. The high density plasma includes $SiH_4$ and $N_2O$ as a raw material gas, and furthermore includes Ar which is used for stabilizing the plasma.

Moreover, in the process A7, for the same reason as one in the exemplary embodiment, film thicknesses of the SOC layer 112, the SOG layer 113, the $SiO_2$ layer 114 and the photo resist layer are set to, for example, 200 nm, 40 nm, 60 nm and 125 nm respectively.

Moreover, in the process A7, the SOG layer 113 is formed on the SOC layer 112 by carrying out heat treatment at 200° C., after a raw material of liquid is applied on the substrate. Moreover, it is possible to form the SOC layer 112 and the photo resist layer 115 with the application method which is used usually.

By carrying out the method, it is possible to suppress the evolution of the poisoning gas from the second upper electrode (TaN in the present exemplary embodiment) which is a lower layer, and to form a desired wiring pattern on the photo resist layer 115.

Figure 24:
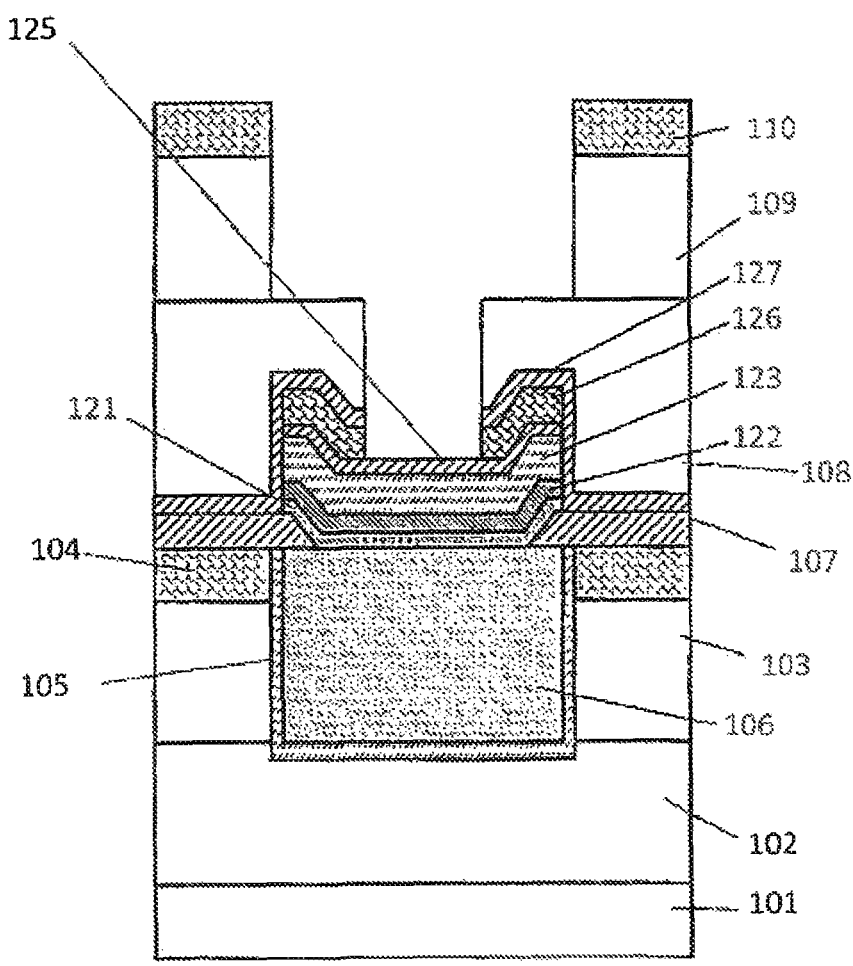
FIG. 24 is a cross section for explaining a method of fabricating the solid electrolyte switch element shown in FIG. 12.

Next, structure shown in FIG. 24 is formed by carrying out the dry etching process and the ashing process which are similar to the processes of forming the structure shown in FIG. 3 up to forming the structure shown in FIG. 6 according to the first exemplary embodiment. Processes of forming the structure shown in FIG. 23 up to forming the structure shown in FIG. 12 through forming the structure shown in FIG. 24 are referred to as a process A8.

In the process A8, it is possible to carry out the dry etching of the multilayer resist structure 116, the dry etching of the cap insulating film 110 and the interlayer insulating film 109 and the removal of the SOC layer 112 by the ashing process with a method which is similar to the method which is explained with reference to FIG. 3 to FIG. 6 in the first exemplary embodiment. By carrying out the above, as shown in FIG. 22, it is possible to form a desired wiring pattern on the cap insulating film 110 and the interlayer insulating film 109.

Moreover, in the process A8, in the case that the second hard mask film 125 is an SiN film or an SiCN film, and the second upper layer electrode 123 is TaN, by carrying out the dry etching process, which uses plasma including CF4, to the second hard mask film 125 which is exposed at a bottom of the via hole 111, it is possible to form an opening part, which reaches an upper surface of the second upper electrode 123, without eroding the second upper layer electrode 123.

Moreover, in the process A8, after forming the opening part reaching the second hard mask film 125, it is possible to form the via plug 118 and the second wiring 119 simultaneously with a method similar to one in the first exemplary embodiment. A material of the second wiring 119 is, for example, copper. When a material of the second wiring 119 and the via plug 118 is a metal whose main component is copper, a material of the barrier metal 117 is, for example, TaN (film thickness 5 nm)/Ta (film thickness 5 nm).

Moreover, in the process A8, the barrier insulating film 120, which is formed on the cap insulating wiring 110 including the second wiring 119, is, for example an SiCN film whose film thickness is 50 nm.

It is possible to form the prescribed wiring without depending on the structure of wiring layer. Thereby, it is possible to improve the property yield of the two-terminal-type solid electrolyte switch element which is connected with the via and the wiring formed as mentioned above, and which is formed in the multi-layered interconnection layer arranged on the semiconductor substrate.

EXAMPLE

Example 1

After structure, which includes the via hole over the solid electrolyte switch element 124 as shown in FIG. 21, is formed, the wiring layer is formed correspondingly to each of the following three cases. That is, three cases includes a case of forming the multilayer resist structure comprising the SOC layer, the SOG layer, the high density $SiO_2$ layer and the photo resist layer in this order from the substrate side according to the present invention, a case of forming the multilayer resist structure not including the high density $SiO_2$ layer, and a case of forming the multilayer resist structure furthermore including a low density $SiO_2$ layer, whose density is lower than 2.1 g/cm$^3$, in place of the high density $SiO_2$ layer. As a result on a yield of the solid electrolyte switch element which acquires the switching function by use of 3 V bias out of all of measured elements, a yield of 85.0% is acquired when using the low density $SiO_2$ layer, and a yield of 79.1% is acquired when not using the $SiO_2$ layer. In contrast, when using the high density $SiO_2$ layer according to the present invention, the switching whose yield is 99.7% is acquired. As a reason, it is conceivable that insertion of the high density $SiO_2$ layer suppresses the poisoning gas, which is evolved from the second upper electrode 123, the second hard mask film 125 or the protective insulating film 127, which is a lower layer, through the via hole 111, from passing, and the desired wiring pattern can be formed without making the photo resist layer inactive.

Example 2

An MRAM (Magnetic Random Access memory) element is formed in the multi-layered interconnection layer arranged on the CMOS device substrate by carrying out the plasma radiating process according to the present invention.

Specifically, after the opening part is formed in the barrier insulating film as shown in FIG. 13(b), a lower electrode of Ta (5 nm)/Ru (5 nm)/Ta (5 nm) is formed on the exposed first wiring 106, and subsequently an antiferromagnetic layer of PtMn (20 nm), a magnetic tunnel junction layer of CoFeB (3 nm)/MgO (1.6 nm)/CoFeB (3 nm), an upper electrode of Ta (5 nm)/Ru (5 nm)/TaN (5 nm), the second hard mask film 125 and the third hard mask film 126 are deposited in this order. Similarly to the second exemplary embodiment, by applying the wiring forming method according to the present invention to the processes which follow the process of depositing the second and the third hard mask films, it is possible to form the MRAM element in the multi-layered interconnection layer.

By setting the multilayer resist structure to be SOC layer/SOG layer/high density $SiO_2$ layer/photo resist layer in this order from the substrate side, a yield of the MRAM element as the magnetic switching is improved to be 97.1% from 77.6% which is a yield acquired when not using the high density $SiO_2$ layer. As a reason why the above mentioned effect is acquired, it is conceivable that the evolution of the poisoning gas from the upper electrode, the second hard mask film 125 or the protective insulating film 127 is suppressed.

Example 3

A phase-change-type memory element is formed in the multi-layered interconnection layer arranged on the CMOS device substrate with the wiring forming method according to the present invention.

Specifically, after forming the opening part in the barrier insulating film as shown in FIG. 13(b), a lower electrode of TiN (5 nm)/W (30 nm)/TiN (5 nm) is formed on the exposed first wiring 106. In the example, TiN and W are used as the barrier metal 105 and the first wiring, respectively. Next, as a phase change type memory layer, $Ge_2Se_2Te_5$ (50 nm) is deposited on the lower electrode of TiN/W/TiN. Next, an upper electrode of TiN/W/TiN which has the same structure as that of the lower electrode, and the second hard mask 125 and the third hard mask 126 are deposited on the upper electrode. It is possible to apply the wiring forming method according to the present invention to the processes, which follow the process of depositing the second and the third hard mask film, similarly to the second exemplary embodiment, and then it is possible to form the phase-change-type memory element in the multi-layered interconnection layer. By setting the multilayer resist structure to be SOC layer/SOG layer/high density $SiO_2$ layer/photo resist layer in this order from the substrate side, a yield of the phase change type memory element as the switching is improved to be 95.2% from 74.9% which is a yield acquired when not using the high density $SiO_2$ layer. A reason why the above mentioned effect is acquired is the same as the reason in the example 3. That is, it is conceivable that the evolution of the poisoning gas from the TiN upper electrode, the second hard mask film 125 or the protective insulating film 127 is suppressed.

Example 4

An ReRAM element is formed in the multi-layered interconnection layer arranged on the CMOS device substrate with the wiring forming method according to the present invention.

Specifically, after forming the opening part in the barrier insulating film as shown in FIG. 13(b), a lower electrode of TaN (5 nm)/Ru (5 nm) is formed on the exposed first wiring 106, and subsequently a variable resistance layer of $TiO_x$ (3 nm)/$TaO_x$ (7 nm) is deposited on the lower electrode of TaN/Ru. Next, similarly to the second exemplary embodiment, an upper electrode of Ru/TaN is formed. By applying the wiring forming method according to the present invention to the processes, which follow the process of forming the upper electrode of Ru/TaN, similarly to the second exemplary embodiment, it is possible to form the phase-change-type memory element in the multi-layered interconnection layer.

By setting the multilayer resist structure to be SOC layer/SOG layer/high density $SiO_2$ layer/photo resist layer in this order from the substrate side, a yield of the ReRAM element as the switching is improved to be 98.0% from 80.9% which is a yield acquired when not using the high density $SiO_2$ layer. As a reason why the yield as the switching is improved also when the ReRAM element which is formed in the multi-layered interconnection layer, it is conceivable that the evolution of the poisoning gas from the upper electrode, the second hard mask film 125 or the protective insulating film 127 is suppressed.

Moreover, the similar improvement of the yield is confirmed also when the ReRAM element which uses a variable resistance layer including a metal oxide such as $HfO_x$, $ZrO_x$, $NiO_x$ or the like.

Example 5

A three-terminal-type solid electrolyte switch element is formed in the multi-layered interconnection layer arranged on the CMOS device substrate with the wiring forming method according to the present invention.

Figure 25:
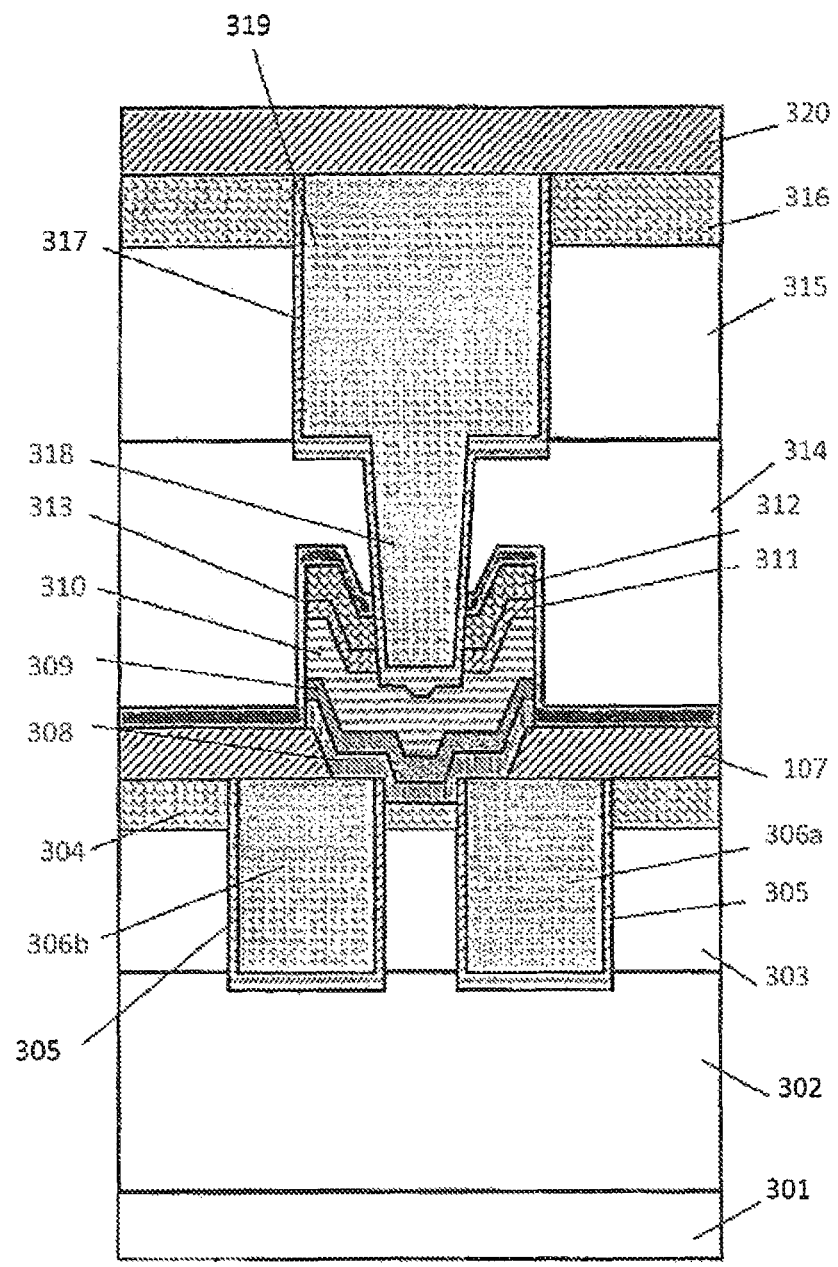
FIG. 25 is a partial cross section showing schematic structure of a three-terminal-type solid electrolyte switch element, which is formed in the multi-layered interconnection layer arranged on a CMOS device substrate, according to the present invention.

As shown in FIG. 25, the three-terminal-type solid electrolyte switch element has structure that an interlayer insulating film 303 and a cap insulating film 304 are interposed between a first lower wiring 306a and a second lower wiring 306b which are separated each other, and each surface of the first lower wiring 306a and the second lower wiring 306b are exposed to an opening part which is formed in the barrier insulating film 107. The first lower wiring 306a and the second lower wiring 306b are made of copper, the interlayer insulating film 303 is SiOCH, the cap insulating film 304 is $SiO_2$, the barrier insulating film is SiCN, and a solid electrolyte layer 308 is SiOCH. When forming the opening part by carrying out the dry etching, the cap insulating film 304, which is interposed between the first lower wiring 306a and the second lower wiring 306b, is caused reduction of the film thickness since the dry etching is carried out to a surface of the cap insulating film 304. After forming the opening part, the solid electrolyte layer 308 is formed on the opening part including the surfaces of the first lower wiring 306a and the second lower wiring 306b. By applying the wiring forming method according to the present invention to the processes, which follow the process of depositing the solid electrolyte layer 308, similarly to the second exemplary embodiment, it is possible to form the three-terminal-type solid electrolyte switch element in the multi-layered interconnection layer.

Also when forming the three-terminal-type solid electrolyte switch element, by using the wiring forming method according to the present invention, a yield as the switching is improved to be 99.7% from 90.4% which is a yield acquired when the high density $SiO_2$ layer is not inserted into the multilayer resist. Furthermore, it is confirmed that a variation width of a threshold voltage of the three-terminal-type solid electrolyte switch element is improved to be ±0.3 V from ±0.7 V.

INDUSTRIAL APPLICABILITY

While the present invention has been explained on the basis of the exemplary embodiments and the examples, the exemplary embodiments and the examples are exemplified merely for explaining the present invention with showing the actual examples, and do not limit the present invention. It is reasonable that a person skilled in the art conceives various modifications and various improved examples on the basis of the above description, and it is understood that the various modifications and the various improved examples are included in the scope of the present invention.

For example, in the exemplary embodiments and the examples, the art on the semiconductor fabrication device including the CMOS circuit, which is corresponding to the background art of the present invention, and the usage field of the present invention, has been explained in detail, and the example of forming the solid electrolyte switch element on the copper wiring arranged on the semiconductor substrate has been explained. However, the present invention is not limited to the above. For example, the present invention is applicable to forming a metallic wiring of a semiconductor product including a memory circuit such as a DRAM (Dynamic Random Access Memory), an SRAM (Static Random Access Memory), a flash memory, an FRAM (Ferro-Electric Random Access Memory), a capacitor, a bipolar transistor or the like, a semiconductor product including a logic circuit such as a microprocessor, or a board or a package on which the plural semiconductor products are mounted simultaneously. Moreover, the present invention is applicable to forming a wiring which connects an electric circuit device, an optical circuit device, a quantum circuit device, a micro machine, an MEMS or the like with a semiconductor device.

DESCRIPTION OF THE CODES

1: first electrode
2: second electrode
3: variable resistance layer
5: solid electrolyte
6: metal atom
101: semiconductor substrate
102: interlayer insulating film
103: interlayer insulating film
104: cap insulating film
105: barrier metal
106: first wiring
107: barrier insulating film
108: inter-via-layer insulating film
109: interlayer insulating film
110: cap insulating film
111: via hole
112: SOC layer
113: SOG layer
114: $SiO_2$ layer
115: photo resist layer
116: multilayer resist structure
117: barrier metal
118: via plug
119: second wiring
120: barrier insulating film
121: solid electrolyte layer
122: first upper electrode
123: second upper electrode
124: solid electrolyte switch element
125: second hard mask film
126: third hard mask film
127: protective insulating film
128: first hard mask film
303: interlayer insulating film
304: cap insulating film
306a: first lower wiring
306b: second lower wiring
308: solid electrolyte layer

The invention claimed is:

1. A wiring forming method comprising:
    forming a multilayer resist structure to form a given resist pattern on a substrate including an interlayer insulating film that has a via hole which have been formed in part thereof and filled with an SOC layer, the multilayer resist structure comprising, at least, an SOC layer, an SOG layer, an $SiO_2$ layer, and a chemically amplification type resist superposed in this order from the substrate side;
    conducting etching using the resist pattern as a mask to form a pattern for a wiring layer and via plugs; and
    forming the wiring layer and the via plugs in the pattern.

2. The wiring forming method according to claim 1, wherein
    an SiCN film or an SiN film is exposed at a bottom of the via hole, and a lower layer of the film is made of at least one of WN, TaN and TiN.

3. The wiring forming method according to claim 1, wherein
    the $SiO_2$ layer is a high density $SiO_2$ layer whose density is 2.1 g/cm$^3$ or higher.

4. The wiring forming method according to claim 3, wherein
    the high density $SiO_2$ layer is formed by use of the high density plasma whose electron density is $10^{10}$ electrons/cm$^3$ or higher.

5. The wiring forming method according to claim 3, wherein
    the high density $SiO_2$ layer is formed under the condition that a substrate temperature is 250° C. or lower to 150° C. or higher.

6. The wiring forming method according to claim 1, wherein
    after raw material of organic silica is applied on the substrate which is rotated, the SOG layer is formed by carrying out thermal treatment.

7. The wiring forming method according to claim 1, wherein
    a total of thicknesses of the SOG layer and the $SiO_2$ layer is 100 nm or less to 50 nm or more.

8. The wiring forming method according to claim 7, wherein
    a thickness of the SOG layer is in an range of 15 nm to 60 nm, and a thickness of the $SiO_2$ layer is in an range of 30 nm to 80 nm.

9. The wiring forming method according to claim 4, wherein
    the high density plasma (HDP) includes, at least, raw material of silane and oxidizing gas.

10. The wiring forming method according to claim 9, wherein
    the high density plasma (HDP) includes, at least, $SiH_4$, $N_2O$ and Ar.

* * * * *